US011925022B2

(12) United States Patent
Russo et al.

(10) Patent No.: US 11,925,022 B2
(45) Date of Patent: Mar. 5, 2024

(54) MICROELECTRONIC AND SEMICONDUCTOR DEVICES WITH A TUNNELING STRUCTURE FREE OF HIGH-γ MATERIAL BY A SELECT GATE STRUCTURE, AND RELATED METHODS

(71) Applicant: Micron Technology, Inc., Boise, ID (US)

(72) Inventors: Ugo Russo, Boise, ID (US); Chris M. Carlson, Nampa, ID (US)

(*) Notice: Subject to any disclaimer, the term of this patent is extended or adjusted under 35 U.S.C. 154(b) by 0 days.

(21) Appl. No.: 17/643,040

(22) Filed: Dec. 7, 2021

(65) Prior Publication Data

US 2022/0102378 A1 Mar. 31, 2022

Related U.S. Application Data

(63) Continuation of application No. 16/542,061, filed on Aug. 15, 2019, now Pat. No. 11,211,399.

(51) Int. Cl.
*H01L 27/11582* (2017.01)
*G11C 5/06* (2006.01)
*H01L 21/28* (2006.01)
*H01L 27/1157* (2017.01)
*H10B 43/27* (2023.01)
*H10B 43/35* (2023.01)

(52) U.S. Cl.
CPC .............. *H10B 43/27* (2023.02); *G11C 5/063* (2013.01); *H10B 43/35* (2023.02)

(58) Field of Classification Search
CPC ........... H01L 27/11582; H01L 27/1157; H01L 29/40117; H01L 27/1158; G11C 5/063; H10B 43/27; H10B 43/35
See application file for complete search history.

(56) References Cited

U.S. PATENT DOCUMENTS

| 4,980,307 | A | 12/1990 | Ito et al. |
| 5,793,677 | A | 8/1998 | Hu et al. |
| 6,266,275 | B1 | 7/2001 | Chen et al. |
| 7,554,853 | B2 | 6/2009 | Sekar et al. |
| 8,462,557 | B2 | 6/2013 | Bhattacharyya |
| 8,709,894 | B2 * | 4/2014 | Lee ........................ G11C 16/14 438/268 |
| 8,867,271 | B2 | 10/2014 | Li et al. |
| 8,873,297 | B2 | 10/2014 | Yamada et al. |

(Continued)

*Primary Examiner* — Shahed Ahmed
*Assistant Examiner* — Khatib A Rahman
(74) *Attorney, Agent, or Firm* — TraskBritt

(57) ABSTRACT

A vertical structure extends through a tiered structure of alternating conductive and insulative materials. The vertical structure includes a channel structure and a tunneling structure. At least one of the conductive materials of the tiered structure provides a select gate tier (e.g., including a control gate for a select gate drain (SGD) transistor). Adjacent the select gate tier of the tiered structure, the tunneling structure consists of or consists essentially of an oxide-only material. Adjacent the word line tiers of the tiered structure, the tunneling structure comprises at least one material that is other than an oxide-only material, such as a nitride or oxynitride. The oxide-only material adjacent the select gate tier may inhibit unintentional loss of charge from a neighboring charge storage structure, which may improve the stability of the threshold voltage (Vth) of the select gate tier.

23 Claims, 31 Drawing Sheets

(56) References Cited

U.S. PATENT DOCUMENTS

| | | | |
|---|---|---|---|
| 8,902,658 B1 | 12/2014 | Raghu et al. | |
| 9,117,700 B2 * | 8/2015 | Oh | H01L 27/1157 |
| 9,209,199 B2 | 12/2015 | Simsek-Ege et al. | |
| 9,230,985 B1 | 1/2016 | Wu et al. | |
| 9,324,439 B1 | 4/2016 | Chen et al. | |
| 9,418,751 B1 | 8/2016 | Dutta et al. | |
| 9,455,261 B1 | 9/2016 | Sun et al. | |
| 10,043,819 B1 * | 8/2018 | Lai | H01L 27/11582 |
| 10,056,399 B2 * | 8/2018 | Costa | H01L 27/11565 |
| 10,134,479 B2 * | 11/2018 | Zhang | G11C 16/08 |
| 10,892,279 B1 * | 1/2021 | Sakotsubo | H01L 27/11582 |
| 2008/0014729 A1 | 1/2008 | Lee et al. | |
| 2008/0023749 A1 | 1/2008 | Kim et al. | |
| 2009/0184360 A1 | 7/2009 | Jin et al. | |
| 2010/0039869 A1 | 2/2010 | Prall | |
| 2012/0104484 A1 | 5/2012 | Lee et al. | |
| 2013/0322174 A1 | 12/2013 | Li et al. | |
| 2015/0279955 A1 | 10/2015 | Choi et al. | |
| 2015/0348988 A1 | 12/2015 | Song et al. | |
| 2016/0099252 A1 | 4/2016 | Tran et al. | |
| 2016/0133638 A1 | 5/2016 | Simsek-Ege et al. | |
| 2016/0315095 A1 | 10/2016 | Sel et al. | |
| 2017/0040061 A1 | 2/2017 | Yeh et al. | |
| 2018/0151588 A1 * | 5/2018 | Tsutsumi | H01L 29/0847 |
| 2019/0051656 A1 | 2/2019 | Carlson et al. | |
| 2019/0051660 A1 | 2/2019 | Carlson | |
| 2019/0051661 A1 | 2/2019 | Carlson | |
| 2019/0074286 A1 | 3/2019 | Singh et al. | |
| 2020/0411105 A1 | 12/2020 | Lee et al. | |

\* cited by examiner

US 11,925,022 B2

MICROELECTRONIC AND SEMICONDUCTOR DEVICES WITH A TUNNELING STRUCTURE FREE OF HIGH-γ MATERIAL BY A SELECT GATE STRUCTURE, AND RELATED METHODS

CROSS-REFERENCE TO RELATED APPLICATION

This application is a continuation of U.S. patent application Ser. No. 16/542,061, filed Aug. 15, 2019, now U.S. Pat. No. 11,211,399, issued Dec. 28, 2021 the disclosure of which is hereby incorporated in its entirety herein by this reference.

TECHNICAL FIELD

The disclosure, in various embodiments, relates generally to apparatus (e.g., devices, systems) with vertical arrays of memory devices that include a charge storage structure, a channel structure, and a tunneling structure. More particularly, this disclosure relates to apparatus (e.g., semiconductor storage devices (e.g., 3D NAND memory devices)) having, and methods for forming, a tiered structure that includes a stack of conductive and insulative materials adjacent a first tunneling structure, the tiered structure also including a select gate tier adjacent a second tunneling structure.

BACKGROUND

Memory provides data storage for electronic systems. Flash memory is one of various memory types and has numerous uses in modern computers and devices. A typical flash memory device may include a memory array that has a large number of charge storage devices (e.g., memory cells, such as, non-volatile memory cells) arranged in rows and columns. In a NAND architecture type of flash memory, storage devices arranged in a column are coupled in series, and the first storage device of the column is coupled to a bit line.

In "three-dimensional NAND" (which may also be referred to herein as "3D NAND"), a type of vertical memory, not only are the storage devices arranged in row and column fashion in a horizontal array, but tiers of the horizontal arrays are stacked over one another (e.g., as vertical strings of storage devices) to provide a "three-dimensional array" of the storage devices. The structure of vertical tiers alternate conductive materials with insulating (e.g., dielectric) materials. Vertical structures, which may each provide a vertical channel structure, extend through the tiered structure. A drain end of a string is adjacent one of the top and bottom of the vertical structure, while a source end of the string is adjacent the other of the top and bottom of the vertical structure. The drain end is operably connected to a bit line, while the source end is operably connected to a source line.

In some 3D NAND structures, the vertical structure may also include a charge storage structure (e.g., a "charge trap" structure, which may also be known as a "storage node"). The charge trap structure may include a charge storage material (e.g., a dielectric material) operable to effectively "trap" and store an electrical charge during writing of the memory device. Erasing the memory device effectively removes the electrical charge from the charge trap structure.

In operating an electronic device that includes a vertical string of 3D NAND memory devices, the conductive tiers of the tiered structure may serve different functions. Some of the conductive tiers may be operable as control gates for word lines (which may be otherwise known as "access lines") of the memory devices, while others of the conductive tiers may be operable as control gates for select gate transistors (which may be otherwise referred to herein as "select gates"), e.g., in a select gate tier of the tiered structure. A conductive tier adjacent the drain end of the string functions as a select gate tier for a drain-side select gate (which may otherwise be known as a "select gate drain (SGD)"), while another conductive tier adjacent the source end of the string functions as a select gate tier for a source-side select gate (which may otherwise be known as a "select gate source (SGS)").

During reading (e.g., "sensing"), writing (e.g., "programming"), and erase functions, voltages supplied to different control gates are controlled. Accurate control of a select gate necessitates its threshold voltage ("Vth") (e.g., the minimum voltage needed to create a conducting pathway between the select gate and a channel structure) being within an expected range. However, the threshold voltage may change unintentionally due to any of a variety of factors, including the unintentional leakage (e.g., loss) of charge from the charge trap structure adjacent the select gate tier. The unintentional charge loss, and its impact on the threshold voltage, may negatively impact the operation and data storage ability of the electronic apparatus. Designing and fabricating structures for such electronic apparatus with stable select gate threshold voltages remains challenging.

DETAILED DESCRIPTION

Figure 1:
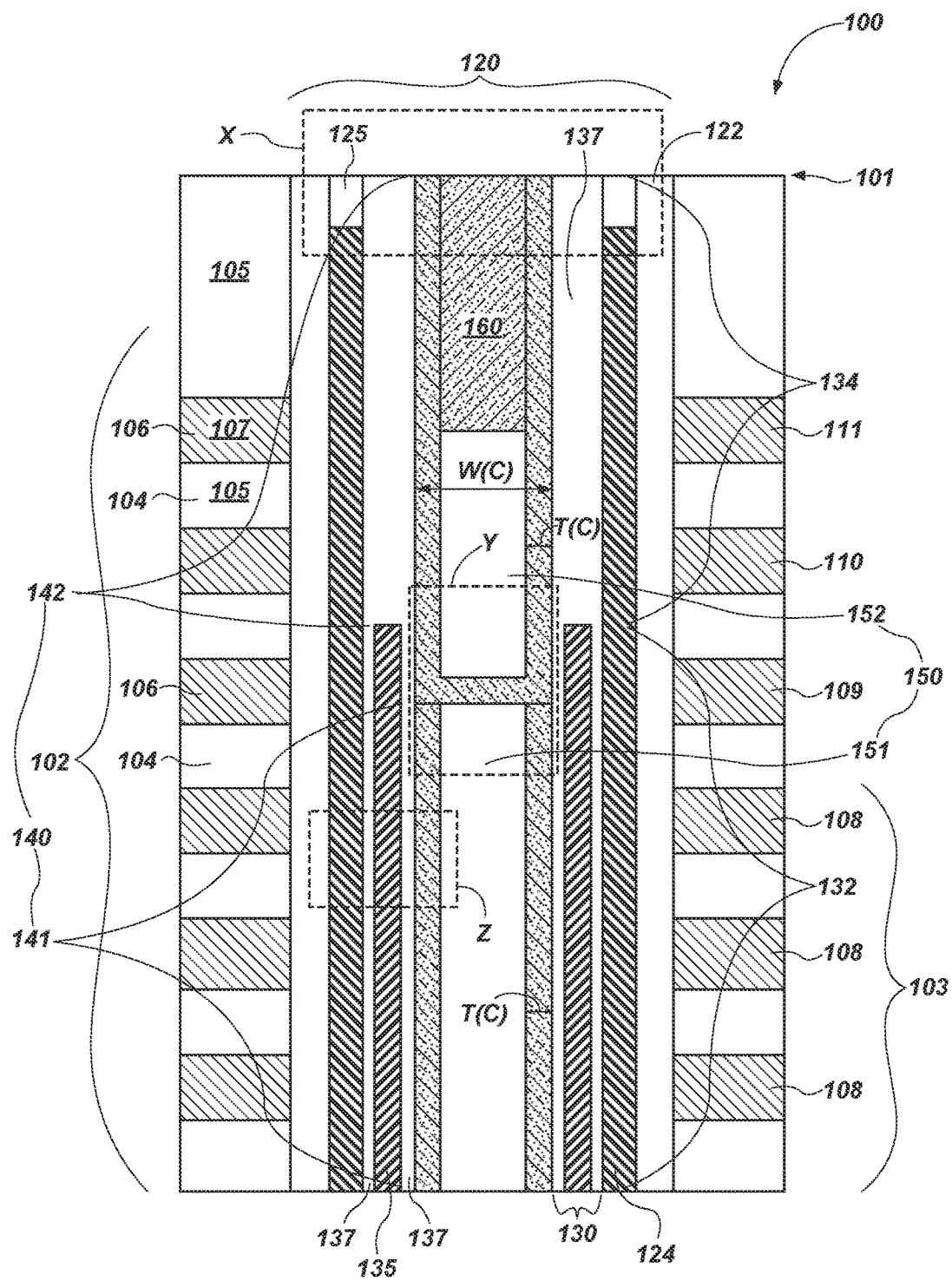
FIG. 1 is a cross-sectional, elevational, schematic illustration of an apparatus structure for an array of storage devices with a 3D NAND architecture, according to embodiments of the disclosure, wherein a thickness of a first tunneling structure is substantially equal to a thickness of a second tunneling structure.

Apparatus (e.g., devices, systems) and the structures (e.g., apparatus structures, component structures) thereof, according to embodiments of the disclosure, include a tiered structure of vertically alternating conductive materials and insulative materials. A vertical structure is formed in an opening that extends through the tiered structure to an underlying material (e.g., a source material). The vertical structure includes a charge trap (CT) structure and a tunneling structure. At least one of the conductive materials of the tiered structure provides a select gate tier for a select gate drain (e.g., a control gate for a select gate drain (SGD) transistor) while others of the conductive materials of the tiered structure provide word line tiers (e.g., control gates for word lines). The tunneling structure includes a first tunneling structure and a second tunneling structure. The first tunneling structure extends vertically along a stack of the word line tiers, and the second tunneling structure extends vertically along the select gate tier. The second tunneling structure, which is adjacent the select gate tier, consists of, or consists essentially of, an oxide-only structure, as defined below. However, the first tunneling structure, which is adjacent the stack comprising the word line tiers, comprises a high-κ material, such as in an oxide-high-κ-oxide composite structure. The oxide-only structure adjacent the select gate tier may inhibit loss of charge from the neighboring CT structure, which may improve the stability of the threshold voltage (Vth) of the SGD of the select gate tier.

As used herein, the term "tiered structure" means and includes a structure with "insulative tiers" interleaved, one above the other, with "conductive tiers." As used herein, the term "insulative tier" means and refers to a level, in a tiered structure, that comprises insulative material. As used herein, the term "conductive tier" means a level, in the tiered structure, that comprises, at least in a completed structure, conductive material of an access line and which conductive tier is disposed vertically between a pair of insulative tiers, e.g., with one insulative tier below and one insulative tier above.

As used herein, the term "stack" means and includes a portion of a tiered structure, which "stack" includes at least some of the conductive tiers of the tiered structure interleaved with at least some of the insulative tiers of the tiered structure. Thus, a "stack" is a sub-structure of a "tiered structure."

As used herein, the term "oxide-only," when referring to a material or structure, means and includes a material or structure consisting essentially of or consisting of a compound in which oxygen is the only anion (e.g., a metal-oxide). Therefore, an "oxide-only" material or structure excludes or substantially excludes a nitride and an oxynitride. Accordingly, the term "oxide-only" material or structure means and includes an oxide material or structure with a nitrogen content of less than about 5 at. % nitrogen (e.g., 1 at. % to 5 at. % nitrogen).

As used herein, the term "opening" means a volume extending through another structure or material, leaving a gap in that other structure or material. Unless otherwise described, an "opening" is not necessarily empty of material. That is, an "opening" is not necessarily void space. An "opening" formed in a structure or material may comprise structures or material other than that in which the opening is formed. And, a structure or material "exposed" within an opening is not necessarily in contact with an atmosphere or non-solid environment. A structure or material "exposed" within an opening may be in contact with or adjacent another structure or material that is disposed within the opening.

As used herein, the term "sacrificial material" means and includes a material that is formed during a fabrication process but that is subsequently removed prior to completion of the fabrication process.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the terms "horizontal" or "lateral" mean and include a direction that is parallel to a primary surface of the substrate on which the referenced material or structure is located. The width and length of a respective material or structure may be defined as dimensions in a horizontal plane.

As used herein, the terms "vertical" or "longitudinal" mean and include a direction that is perpendicular to a primary surface of the substrate on which a referenced material or structure is located. The height of a respective material or structure may be defined as a dimension in a vertical plane.

As used herein, the terms "inner" and "outer" are relative terms indicating a disposition relative to a longitudinal axis of a structure. Materials, structures, and sub-structures nearest the longitudinal axis may be construed as "inner" or "inward" relative to other materials, structures, and sub-structures further from the longitudinal axis, which other materials, structures, and sub-structures may be construed as "outer" or "outward" relative to the inner or inward materials, structures, and sub-structures.

As used herein, the terms "thickness," "thinness," or "height" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one element's or feature's relationship to another element(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprises," "comprising," "includes," and/or "including" specify the presence of stated features, structures, stages, operations, elements, materials, components, and/or groups, but do not preclude the presence or addition of one or more other features, structures, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

Reference will now be made to the drawings, where like numerals refer to like components throughout. The drawings are not necessarily drawn to scale.

FIG. 1 illustrates a structure 100, according to embodiments of the disclosure, for an apparatus (e.g., for an array of storage devices with a 3D NAND architecture). The structure 100 is otherwise referred to herein as an "apparatus structure 100." The apparatus structure 100 may be included in any of a variety of electronic apparatus, such as a memory device, an integrated circuit, or other apparatus that includes one or more cells to store charge.

The apparatus structure 100 includes a tiered structure 102 of vertically alternating material tiers, including a stack 103 of the vertically alternating material tiers. The tiered structure 102—and the stack 103 thereof—includes insulative tiers 104 interleaved with conductive tiers 106. A bit line (not illustrated) may underlay the tiered structure 102, and the tiered structure 102 may be supported by a base material (e.g., a substrate (e.g., polysilicon)) (not illustrated).

In some embodiments, the insulative tiers 104 of the tiered structure 102 (and of the stack 103 thereof) comprise an insulative material 105 (e.g., a dielectric material (e.g., an oxide (e.g., a tier oxide material) (e.g., silicon dioxide))), and the conductive tiers 106 comprise conductive material 107 (e.g., one or more conductive metal or metallic compounds (e.g., tungsten (W)), one or more conductive nitride materials (e.g., a tier nitride material) (e.g., titanium nitride), and/or one or more conductive polysilicon materials). For example, one or more of the conductive tiers 106 may provide a conductive structure (e.g., gate) with a tungsten sub-structure disposed on a conductive titanium nitride sub-structure.

The conductive tiers 106 of the stack 103 may include control gates for access lines (e.g., control gates for word lines), referred to herein generally as "word lines" or "word line tiers" 108. Also within the tiered structure 102, and above the stack 103, may be one or more "dummy" tiers (e.g., dummy word line tiers 109); one or more control gate tiers for select gate transistors (referred to herein generally as a "select gate tier" 110) (e.g., for a select gate drain (SGD)), and may include a gate-induced drain leakage (GIDL) generator tier 111. The word line tiers 108, of the stack 103, may be adjacent (e.g., at lower elevations than) the dummy word line tier(s) 109, which may be adjacent (e.g., at lower elevations than) the select gate tier(s) 110, which may be adjacent (e.g., at lower elevations than) the GIDL generator tier 111. Though FIG. 1 illustrates only a single select gate tier 110, only a single dummy word line tier 109, and three word line tiers 108, in other embodiments, multiple select gate tiers 110 may be between the GIDL generator tier 111 and the dummy word line tier(s) 109; and/or multiple dummy word line tiers 109 may be between the select gate tier(s) 110 and the word line tiers 108, each interleaved with insulative material 105 of the insulative tiers 104.

In some embodiments, all of the insulative material 105 of the tiered structure 102—and/or of the stack 103 of the tiered structure 102—may have the same composition. In other embodiments, the composition of the insulative material 105 may be different in some of the insulative tiers 104. A thicker portion of the insulative material 105 may be at higher elevations of the tiered structure 102 than an uppermost conductive tier 106 of the tiered structure 102, which thicker portion may have the same or different composition as the insulative material 105 within the insulative tiers 104.

The conductive material 107 of the conductive tiers 106 may be formulated, and the tier configured (e.g., structured), according to the function to be performed by the respective tier of the conductive material 107. The compositions and structures for the conductive tiers of 3D NAND strings, are known in the art and so are not described in detail herein.

A vertical structure 120 extends vertically through the tiered structure 102, including through the word line tiers 108 of the stack 103, the dummy word line tier(s) 109, the select gate tier(s) 110, and the GIDL generator tier 111. The vertical structure 120 includes materials concentrically about (e.g., around) a longitudinal axis of the vertical structure 120. From outside to inside, the 120 may include a charge-blocking structure 122 (e.g., a dielectric barrier) of a charge-blocking material (e.g., comprising, consisting essentially of, or consisting of an oxide material (e.g., a silicon dioxide)), a charge trap structure 124 (e.g., a storage node), a tunneling structure 130, and a channel structure 140 (e.g., a doped hollow channel (DHC) comprising, consisting essentially of, or consisting of a doped polysilicon).

The charge trap structure 124 comprises a charge storage material formulated and configured to store charge received from the channel structure 140 during operation of the apparatus (e.g., device (e.g., memory device), system) that includes the apparatus structure 100. The charge trap structure 124, and the charge storage material thereof, may comprise, consist essentially of, or consist of a dielectric nitride material (e.g., silicon nitride). In some embodiments, a segment 125 of a dielectric material (e.g., an oxide of the charge storage material of the remainder of the charge trap structure 124, i.e., an oxide of a silicon nitride (e.g., a silicon oxynitride)) may be formed adjacent the charge trap structure 124, proximate an upper surface 101 of the apparatus structure 100.

The tunneling structure 130 comprises dielectric materials and may be configured as an engineered structure to exhibit a desired equivalent oxide thickness (EOT). The EOT quantifies the electrical properties of the tunneling structure 130, such as capacitance, of a dielectric in terms of a representative physical thickness. The EOT may be understood as the thickness of a theoretical region of silicon dioxide ($SiO_2$) that would be required to exhibit the same capacitance density as the given dielectric region (e.g., the tunneling structure 130), ignoring leakage current and reliability considerations.

The tunneling structure 130 comprises dielectric materials providing a first tunneling structure 132 (e.g., a "lower" tunneling structure) and a second tunneling structure 134 (e.g., an "upper" tunneling structure). The first tunneling structure 132 extends vertically along at least lower tiers of the tiered structure 102, namely, the tiers of the stack 103, which tiers include the word line tiers 108. Optionally, the first tunneling structure 132 also extends vertically along the dummy word line tier(s) 109. However, the first tunneling structure 132 does not extend to levels of the select gate tier(s) 110. The second tunneling structure 134 extends vertically along at least the select gate tier(s) 110 and, optionally, also along the GIDL generator tier(s) 111.

The first tunneling structure 132 comprises at least one material that is not an oxide-only material and that exhibits a dielectric constant ($\kappa$) greater than that of silicon dioxide ($SiO_2$). Accordingly, this material may comprise a "high-$\kappa$" material 135. In contrast, the second tunneling structure 134 consists essentially of or consists of an oxide-only material 137 (e.g., silicon dioxide ($SiO_2$)). Thus, the second tunneling structure 134 may be an oxide-only structure. The second tunneling structure 134 may be devoid of a high-$\kappa$ material (including, being devoid of the high-$\kappa$ material 135 of the first tunneling structure 132).

In some embodiments, the first tunneling structure 132 may comprise a nitride (e.g., silicon nitride) or an oxynitride (e.g., silicon oxynitride) as the high-$\kappa$ material 135. The high-$\kappa$ material 135 may be disposed laterally between sub-structures of the oxide-only material 137 (e.g., silicon dioxide), which may act as dielectric barriers. Therefore, the first tunneling structure 132 may be a composite structure, such as an oxide-high-$\kappa$-oxide composite structure. The oxide-only material 137 of dielectric barriers in the first tunneling structure 132 may extend vertically along the tunneling structure 130 and be integrated with the oxide-only material 137 of the second tunneling structure 134.

The charge-blocking structure 122 may be adjacent to (e.g., directly adjacent to) the charge trap structure 124. The charge-blocking structure 122 provides a mechanism to block charge from flowing between the charge trap structure 124 and the conductive material 107 of the conductive tiers 106 (e.g., to control gates). Therefore, the charge-blocking structure 122 may comprise a "control dielectric." The charge-blocking structure 122 is formed of a charge-blocking material, which comprises, consists essentially of, or consists of a dielectric material (e.g., an oxide). Though illustrated, in FIG. 1, as a single structure of material, in other embodiments the charge-blocking structure 122, and the charge-blocking material thereof, may include multiple, concentric material sub-structures.

The channel structure 140 is operable to conduct a current from the conductive material 107 in controlling the storage of charge in the charge trap structure 124. The channel structure 140 includes a first channel structure 141 (e.g., a "lower" channel structure) and a second channel structure 142 (e.g., an "upper" channel structure) in electrical connection within one another. The first channel structure 141 extends vertically along at least the stack 103, including the word line tiers 108, while the second channel structure 142 extends vertically along at least the select gate tier(s) 110. The first and second channel structures 141, 142 may be in direct physical contact with one another. In some embodiments, the first channel structure 141 may come into direct physical contact with the second channel structure 142 at an elevation (e.g., level) that includes the dummy word line tier(s) 109 or at an elevation (e.g., level) that includes one of the insulative tiers 104 that are directly above or below the dummy word line tier(s) 109. In some embodiments, the second channel structure 142 may extend vertically along the vertical structure 120, such that the lowest surface of the second channel structure 142 is at a lower elevation (e.g., level) than an uppermost surface of the first tunneling structure 132.

The channel structure 140, and the first and second channel structures 141, 142 thereof, comprise at least one semiconductor material (e.g., polycrystalline silicon ("polysilicon")). The composition of the semiconductor material(s) of the first channel structure 141 may be the same or different than the composition of the semiconductor material(s) of the second channel structure 142.

The center of the vertical structure 120 (e.g., along the longitudinal axis of the vertical structure 120) may be partially filled by a dielectric fill structure 150 (e.g., one or more dielectric materials (e.g., an oxide material (e.g., silicon dioxide))). In some embodiments, the dielectric fill structure 150 may provide a first fill structure 151 (e.g., a "lower" fill structure) (central to the first channel structure 141, through the elevations of at least the stack 103 that includes the word line tiers 108) and a second fill structure 152 (e.g., an "upper" fill structure) (central to the second channel structure 142, through the elevations of at least the select gate tier(s) 110). The composition of the dielectric material of the first and second fill structures 151, 152 may be the same or different.

At higher elevations of the apparatus structure 100, the dielectric fill structure 150 may be adjacent a plug 160 (e.g., a conductive plug) comprising a polycrystalline silicon filling the remaining central portion of the vertical structure 120. For example, the plug 160 may be disposed in an upper portion of the channel structure 140, and the plug 160 may extend to an elevation (e.g., level) of the GIDL generator tier(s) 111.

In operation of an electronic apparatus (e.g., device, system) comprising the apparatus structure 100, the inclusion of the oxide-only second tunneling structure 134, adjacent the select gate tier(s) 110, may inhibit unintentional loss of charge from the portion of the charge trap structure 124 that is adjacent the select gate tier(s) 110. That is, the oxide-only material in the second tunneling structure 134 may effectively eliminate what may otherwise be areas at which conductive pathways could be formed to or from the channel structure 140. Therefore, the select gate tier(s) 110, which may include control gates that are not needed to be erased during operation of the electronic apparatus, may retain their initial charged state, and the threshold voltage (Vth), e.g., of the select gate drain of the select gate tier(s) 110, may be less vulnerable to unwanted change during operation or storage of the electronic apparatus. Moreover, the inclusion of oxide-only material in the tunneling structure 130, namely the second tunneling structure 134, adjacent the select gate tier(s) 110 may also provide a greater EOT along that portion of the tunneling structure 130 (e.g., along the second tunneling structure 134), compared to the EOT along the first tunneling structure 132.

According to the embodiment of FIG. 1, the channel structure 140 comprises a consistent or substantially consistent horizontal (e.g., transverse) outer dimension along the height of the vertical structure 120. Thus, a channel width W(C) at lower elevations, e.g., of the first channel structure 141, may be the same or substantially the same as the channel width W(C) at higher elevations, e.g., of the second channel structure 142.

Figure 2:
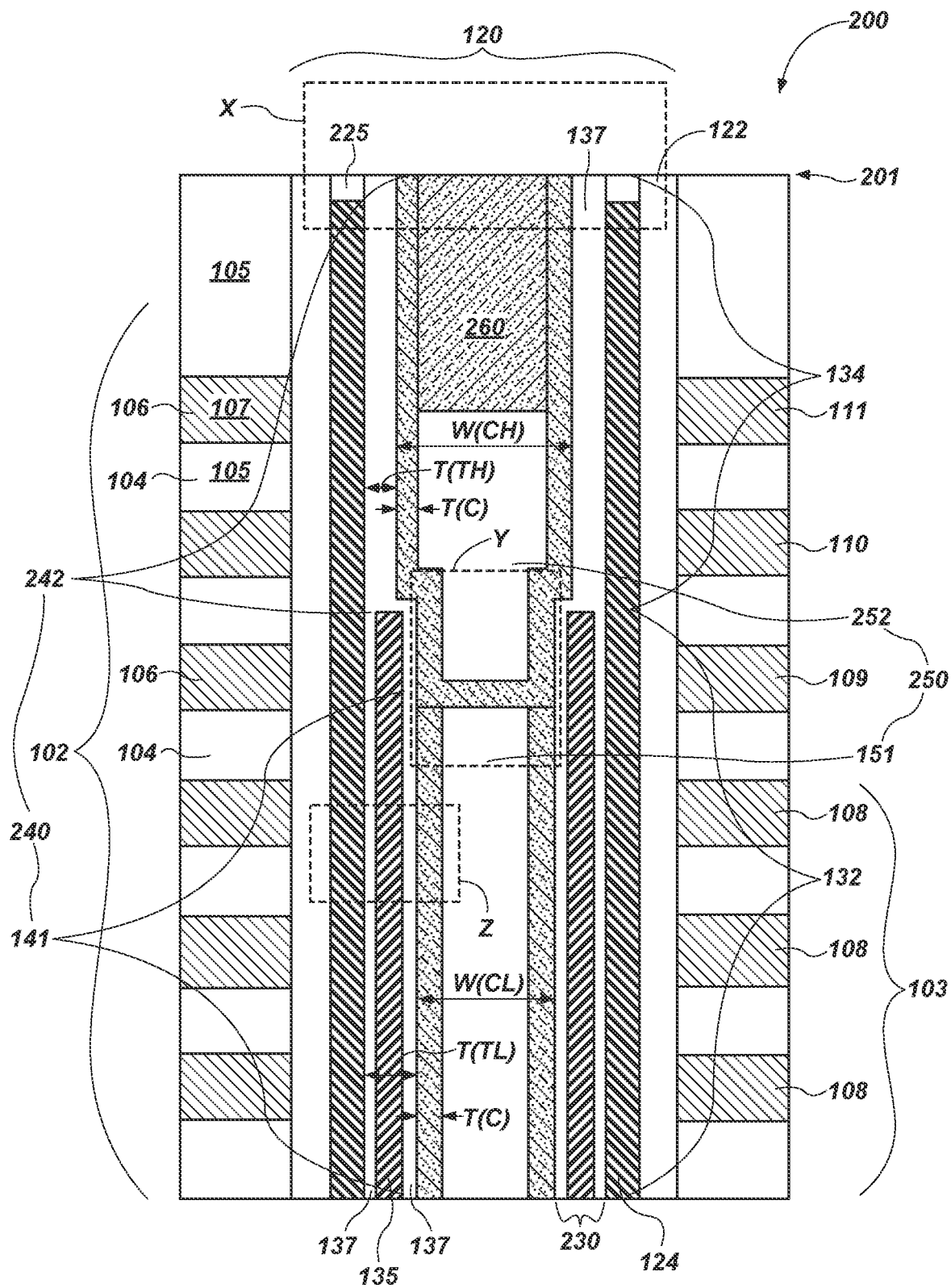
FIG. 2 is a cross-sectional, elevational, schematic illustration of an apparatus structure for an array of storage devices with a 3D NAND architecture, according to embodiments of the disclosure, wherein a thickness of a first tunneling structure is different than a thickness of a second tunneling structure.

In other embodiments, such as that illustrated in FIG. 2, an apparatus structure 200 may include a channel structure 240 (which may include the same material(s) as described above for the channel structure 140 of FIG. 1) with different horizontal (e.g., transverse) outer dimensions at different elevations along the vertical structure 120. For example, a channel width W(CL) at lower elevations, including the first channel structure 141, may be less than a channel width W(CH) at higher elevations, including along an upper portion of the second channel structure 242. A thickness of a tunneling structure 230 (which may include the same materials as described above for the tunneling structure 130 of FIG. 1) may comprise different thicknesses along the second tunneling structure 134 compared to the first tunneling structure 132. For example, a tunnel thickness T(TH) along all or most of the second tunneling structure 134 (e.g., along the oxide-only structure) may be thinner than a tunnel thickness T(TL) along all or most of the first tunneling structure 132 (e.g., along the oxide-high-κ-oxide composite structure). A plug 260 (e.g., a conductive plug) (which may comprise the same material as the plug 160 of FIG. 1) may comprise a consistent horizontal (e.g., transverse) outer dimension.

The horizontal (e.g., transverse) outer dimension of the channel structure 240 (e.g., channel width W(CH)) may be greater at elevations above the high-κ material 135 of the tunneling structure 230 than (e.g., channel width W(CL)) at elevations including the high-κ material 135, proximate the dummy word line tier(s) 109. Therefore, the transverse outer dimension of the first channel structure 141 may be lesser than the transverse outer dimension defined by a portion (e.g., a majority) of the second channel structure 242. The second channel structure 242 nonetheless electrically connects with (e.g., is in direct physical contact with) the first channel structure 141 of the channel structure 240.

A horizontal (e.g., transverse) outer dimension of a dielectric fill structure 250 (which may comprise the same material as the dielectric fill structure 150 of FIG. 1) may also comprise portions with greater horizontal (e.g., transverse) outer dimensions than other portions. For example, a second fill structure 252 may comprise a greater width (e.g., greater horizontal (e.g., transverse) outer dimension) at elevations above the high-κ material 135 than at elevations including the high-κ material 135. Thus, as the channel structure 240 and the dielectric fill structure 250 extend to higher elevations than the uppermost surface of the high-κ material 135, the channel structure 240 and the dielectric fill structure 250 expand laterally to comprise a greater horizontal (e.g., transverse) outer dimension. These dimensions may be substantially unchanging during use of the apparatus structure 200.

Like the segment 125 of oxidized charge storage material adjacent the charge trap structure 124 of the apparatus structure 100 of FIG. 1, a segment 225 of oxidized material (e.g., oxidized charge storage material, e.g., a silicon oxynitride) may also be adjacent an upper surface 201 of the apparatus structure 200 of FIG. 2. In other embodiments, such as those illustrated in FIGS. 3A and 3B (each illustrating an area of structures, according to the other embodiments, corresponding to Box X of FIGS. 1 and 2, respectively), no oxidized charge storage material segment 125, 225 may be included along the upper surface 101, 201, respectively.

In some embodiments, the second channel structures 142, 242 of the channel structures 140, 240 of the apparatus structures 100, 200 (FIGS. 1, 2, respectively) directly contact the first channel structures 141 with the material of the second channel structures 142, 242 extending across the width of the channel structures 140, 240 (e.g., across channel width W(C) of FIG. 1 and of channel width W(CL) of FIG. 2). Including a horizontally-extending portion of the channel material of the channel structure 140, 240 along the floor of the second channel structure 142, 242 may be beneficial for electrical connection between the second channel structure 142, 242 and its corresponding first channel structure 141. Therefore, the first fill structures 151 of the dielectric fill structures 150, 250 (FIGS. 1, 2, respectively), are spaced from the second fill structures 152, 252 (FIGS. 1, 2, respectively) by material of the channel structure 140, 240 (FIGS. 1, 2, respectively). In other embodiments, such as those illustrated in FIGS. 3C and 3D (each illustrating an area of structures, according to the other embodiments, corresponding to Box Y of FIGS. 1 and 2, respectively), the first fill structure 151 of the dielectric fill structure 150, 250 may be in direct physical contact with the second fill structure 152, 252 of the dielectric fill structure 150, 250 (FIGS. 3C, 3D, respectively). In other words, the material of the channel structure 140, 240 may not extend across its width, but the material of the dielectric fill structure 150, 250 (FIGS. 3C, 3D, respectively) may extended, without interruption, along a height of the vertical structure 120. The first channel structure 141 and its corresponding second channel structure 142, 242 (FIGS. 3C, 3D, respectively) are nonetheless in electrical contact with one another.

While FIGS. 1 and 2 illustrate the second channel structure 142, 242 (FIGS. 1, 2, respectively) comprising a thickness T(C) (e.g., horizontal dimension between the tunneling structure 130, 230 and the dielectric fill structure 150, 250 (FIGS. 1, 2, respectively)) that is the same, or about the same, as the thickness T(C) of the first channel structure 141, in other embodiments, the relative thicknesses of the second channel structure 142, 242 to the first channel structure 141 may be otherwise tailored to performance needs of the apparatus structures 100 (FIG. 1), 200 (FIG. 2). Such other embodiments, e.g., are illustrated in FIGS. 3E, 3F, 3G, and 3H. For example, as illustrated in FIGS. 3E and 3F (each illustrating an area of structures, according to other embodiments, corresponding to Box Y of FIGS. 1 and 2, respectively), the second channel structure 142 (FIG. 3E), 242 (FIG. 3F) may be of a greater thickness T(CH) than a thickness T(CL) of the first channel structure 141. As another example, as illustrated in FIGS. 3G and 3H (each illustrating an area of structures, according to other embodiments, corresponding to Box Y of FIGS. 1 and 2, respectively), the second channel structure 142 (FIG. 3G), 242 (FIG. 3H) may be of a lesser thickness T(CH) than the thickness T(CL) of the first channel structure 141. Accordingly, embodiments of the disclosure enable tailoring of the thickness of the channel material along different elevations in the vertical structure 120 (FIGS. 1, 2).

While FIG. 1 illustrates the first tunneling structure 132 as a composite structure including three material sub-structures, namely a pair of sub-structures of the oxide-only material 137 on either side of a sub-structure with the high-κ material 135, such that the first tunneling structure 132 is an oxide-high-κ-oxide composite structure, in other embodiments, the first tunneling structure 132 may include fewer or more sub-structures. For example, the first tunneling structure 132 of the tunneling structure 130 may alternatively be structured to include one, two, four, or more sub-structures, at least one of which comprising, consisting essentially of, or consisting of a non-oxide-only material (e.g., the high-κ material 135). For a more particular example, with reference to FIG. 3I (which is an enlarged, alternative view of Box Z from FIG. 1 or FIG. 2), a tunneling structure 330 may include, in the first tunneling structure 132 (FIG. 1 or 2) a composite structure of two material sub-structures, such as the high-κ material 135 (e.g., directly adjacent the charge trap structure 124) and one sub-structure of the oxide-only material 137 (e.g., directly between the high-κ material 135 and the channel material of the channel structure 140). The selection of sub-structures, the materials therefor, and the thicknesses therefore may be tailored to meet the performance needs of the first tunneling structure 132 of the tunneling structure 130.

Accordingly, disclosed is a semiconductor device comprising a stack of alternating insulative tiers and conductive tiers. A select gate tier is over the stack. A channel structure extends through the stack and through the select gate tier. A first tunneling structure is between the channel structure and the stack. The first tunneling structure comprises a composite structure including a high-κ material. A second tunneling structure is between the channel structure and the select gate tier. The second tunneling structure is devoid of the high-κ material.

With reference to FIGS. 4 through 17, illustrated are various stages of a method of forming the apparatus structure 100 of FIG. 1. A tiered material structure 402 of vertically alternating insulative material 105 tiers and another material 407 tiers may be formed (e.g., over a base material (e.g., a substrate, which may already support a conductive material for a bit line (not illustrated))) by forming (e.g., depositing) the materials thereof in sequence, one after the other, from lower-to-upper elevations. The tiered material structure 402 includes a material stack 403 that will eventually become the word line tiers 108 (FIG. 1). In some embodiments, the other material 407 may be a sacrificial material and may comprise, e.g., a nitride (e.g., a silicon nitride). In other embodiments, the other material 407 may not be a sacrificial material but may be formed as the conductive material 107 (FIG. 1).

An opening may be formed (e.g., by a removal process (e.g., etching)) through the tiered material structure 402, including through the material stack 403, for each vertical string of storage devices that is to be formed. Each opening may be cylindrical in shape (e.g., having a circular horizontal cross section) or some other shape that vertically extends through the tiered material structure 402, including through the material stack 403.

Materials (e.g., cell materials) may be formed (e.g., conformally formed) on the sidewalls defining the opening, from outward to inward in succession. For example, the charge-blocking material of the charge-blocking structure 122 may be formed (e.g., deposited) on (e.g., directly on) sidewalls of the insulative material 105 and the other material 407. The charge storage material of the charge trap structure 124 may be formed (e.g., deposited) on (e.g., directly on) the charge-blocking structure 122 (e.g., on a sidewall of the charge-blocking material). The material or materials of the tunneling structure 130 (e.g., the tunneling material(s)) may be formed (e.g., deposited) directly on the charge trap structure 124 (e.g., on a sidewall of the charge storage material). For example, in the tunneling structure 130 including the oxide-high-κ-oxide composite structure for the first tunneling structure 132, a first oxide layer of the oxide-only material 137 may be formed (e.g., deposited) on (e.g., directly on) the charge storage material (e.g., on a sidewall of the charge storage material) of the charge trap structure 124; the high-κ material 135 may be formed (e.g., deposited) on (e.g., directly on) the first oxide layer of the oxide-only material 137 (e.g., on a sidewall of the oxide-only material 137); and a second oxide layer of the oxide-only material 137 may be formed (e.g., deposited) on (e.g., directly on) the high-κ material 135. A channel material 441 (e.g., a polysilicon material) may then be formed on the material(s) of the tunneling structure 130 (e.g., directly on the second oxide layer of the oxide-only material 137) and, optionally, on an upper surface 401. An opening 440 may remain along a longitudinal axis of what will become the vertical structure 120 (FIG. 1).

Figure 4:
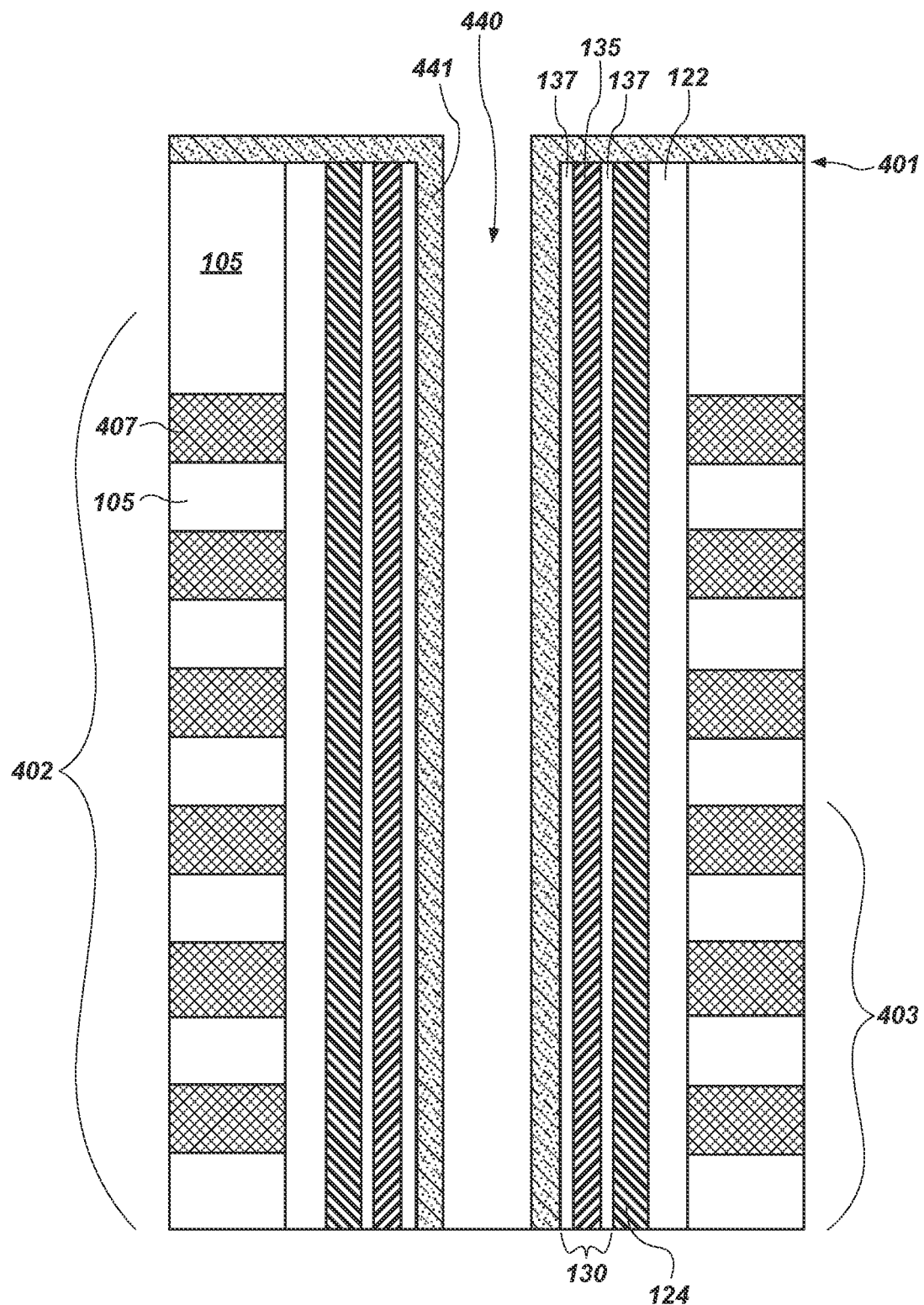
FIGS. 4 through 17 are cross-sectional, elevational, schematic illustrations during various stages of processing to fabricate the apparatus structure of FIG. 1, according to embodiments of the disclosure.
Figure 5:
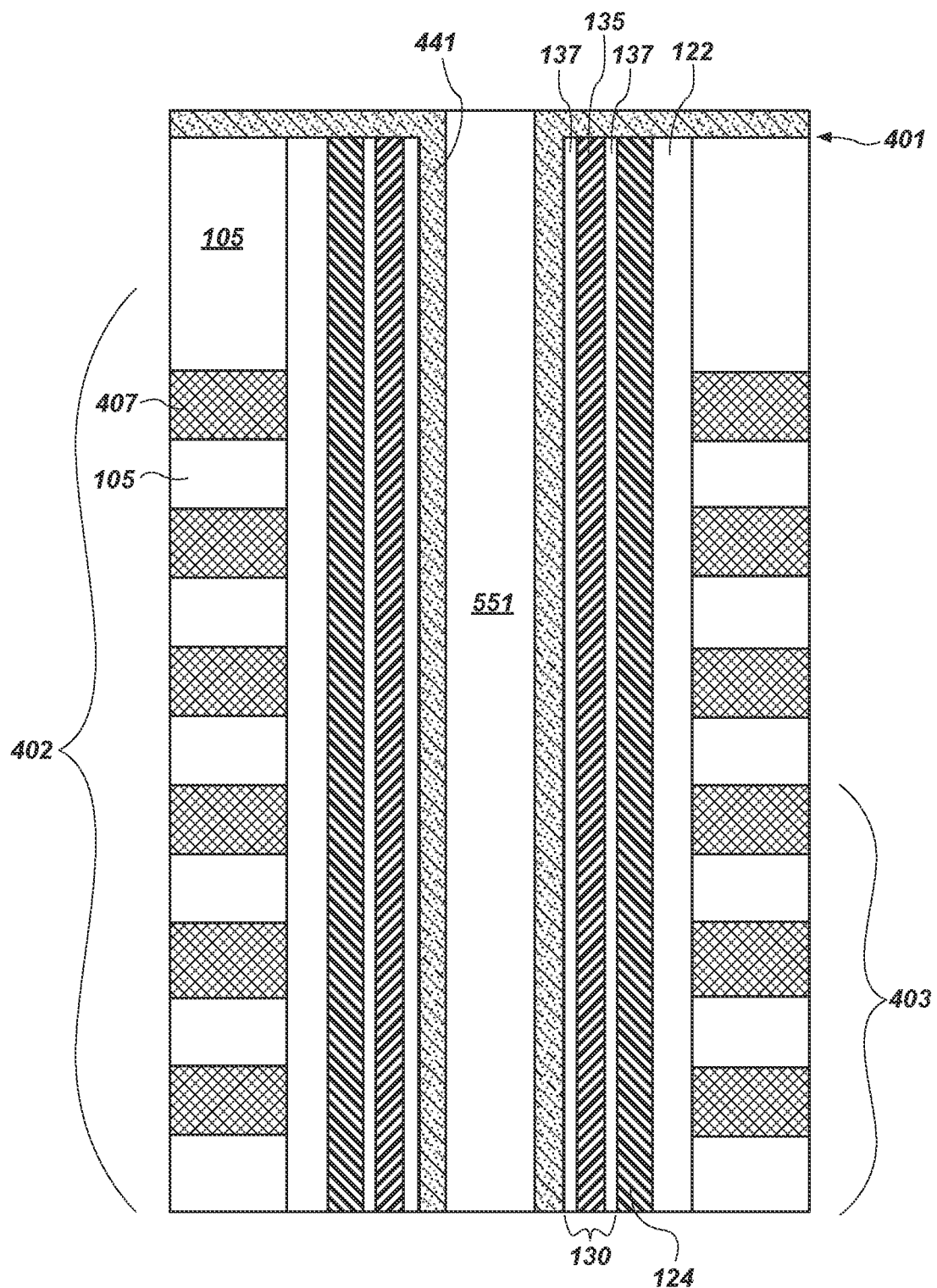

With reference to FIG. 5, a dielectric material 551 (e.g., an oxide fill material comprising, consisting essentially of, or consisting of an oxide (e.g., a silicon dioxide)) of what will become the first fill structure 151 (FIG. 1) may be formed (e.g., deposited) to fill or substantially fill the opening 440 (FIG. 4). In some embodiments, the dielectric material 551 may be formed to overfill the opening 440, with portions formed above the upper surface 401 and the channel material 441. These overfilled portions of the dielectric material 551 may be removed (e.g., by chemical mechanical polishing (CMP)) to expose the channel material 441 on the upper surface 401. In other embodiments, the dielectric material 551 may not be formed to overfill the opening 440 (FIG. 4). In still other embodiments, if the dielectric material 551 is formed to overfill the opening 440, the overfilled portion of the dielectric material 551 may not be removed at this stage in the method.

Figure 6:
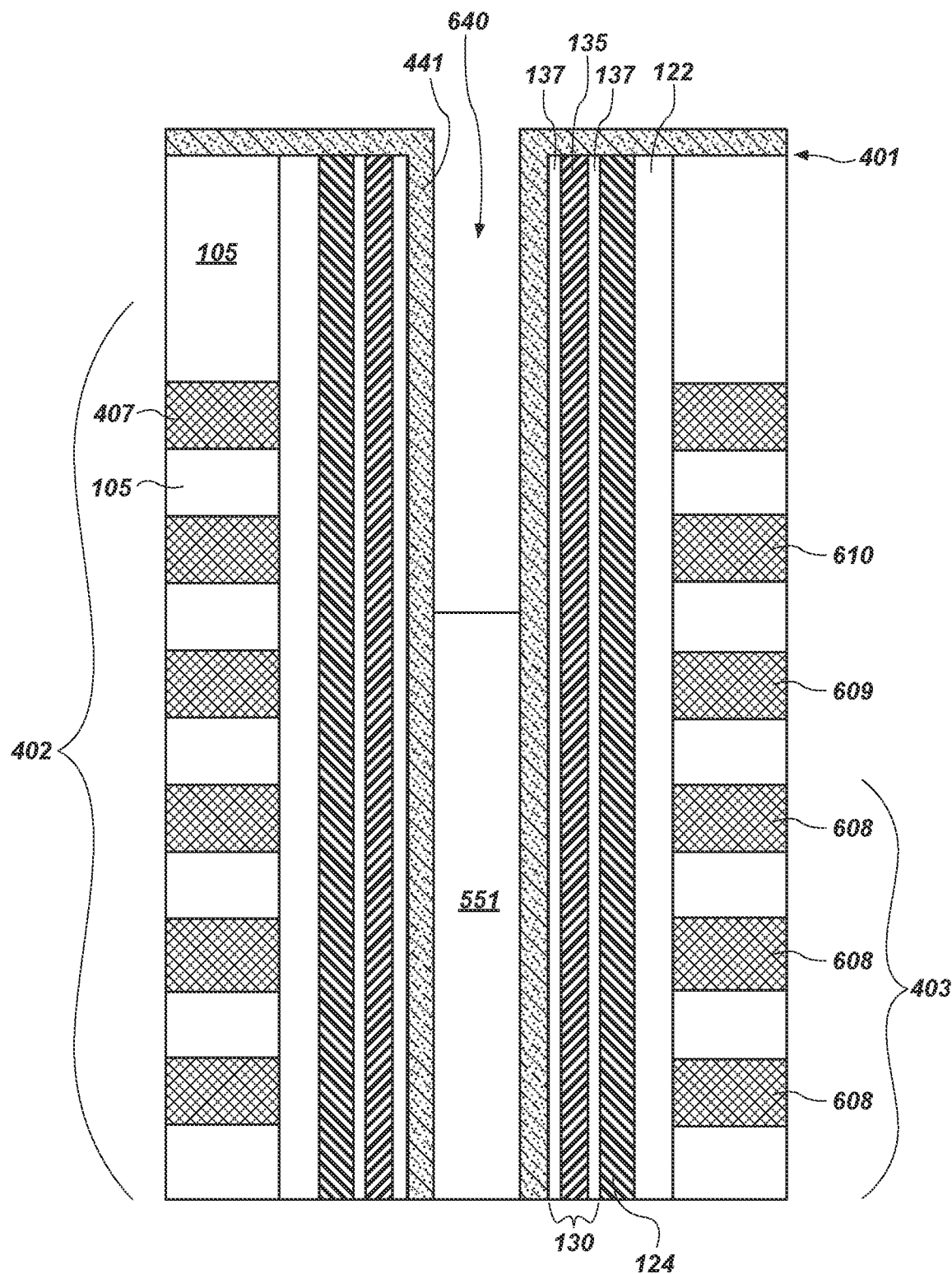

With reference to FIG. 6, an upper portion of the dielectric material 551 may be removed (e.g., etched) to recess the dielectric material 551 (e.g., the oxide fill material) to an elevation at least lower than the elevation of the other material 407 occupying a tier (or tiers) 610 that will eventually become the select gate tier(s) 110 (FIG. 1) and at least higher than an elevation of the material stack 403 that includes the other material 407 occupying tiers 608 that will eventually become the word line tiers 108 (FIG. 1). The recessed height for the dielectric material 551 may be above an elevation of the other material 407 occupying a tier (or tiers) 609 that will eventually become dummy word line tier(s) 109 (FIG. 1). In other embodiments, the recessed height may be along or below an elevation of the other material 407 occupying the tier(s) 609 for the dummy word line tier(s) 109. Thus, the recessed height of the dielectric material 551—and, therefore, the depth of opening 640—may be tailored to accommodate process margins.

Figure 7:
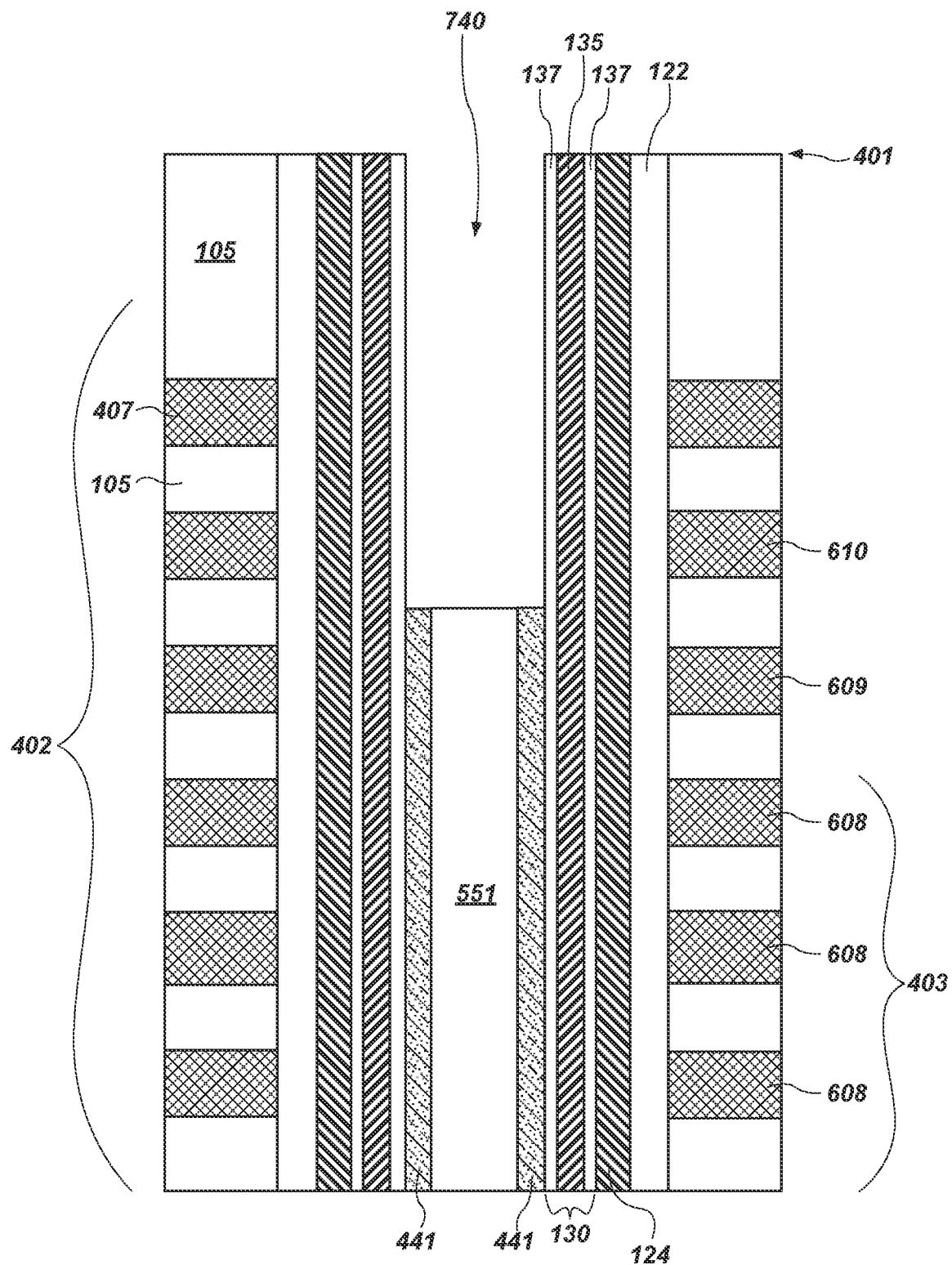

With reference to FIG. 7, the portions of the channel material 441 that were exposed in the opening 640 (FIG. 6) may be removed (e.g., by etching (e.g., by wet etching)) to expose, within an opening 740, the inner-most material (e.g., the innermost sub-structure of the oxide-only material 137) of the tunneling structure 130. For example, the second oxide layer of the oxide-only material 137 may be exposed in the opening 740. The channel material 441 may be recessed to be substantially coplanar with the dielectric material 551. In other embodiments, the channel material 441 may be recessed below the uppermost surface of the dielectric material 551. Removing the upper portion of the channel material 441 also exposes the upper surface 401 and the uppermost portion of, e.g., the charge storage material of the charge trap structure 124.

Figure 8:
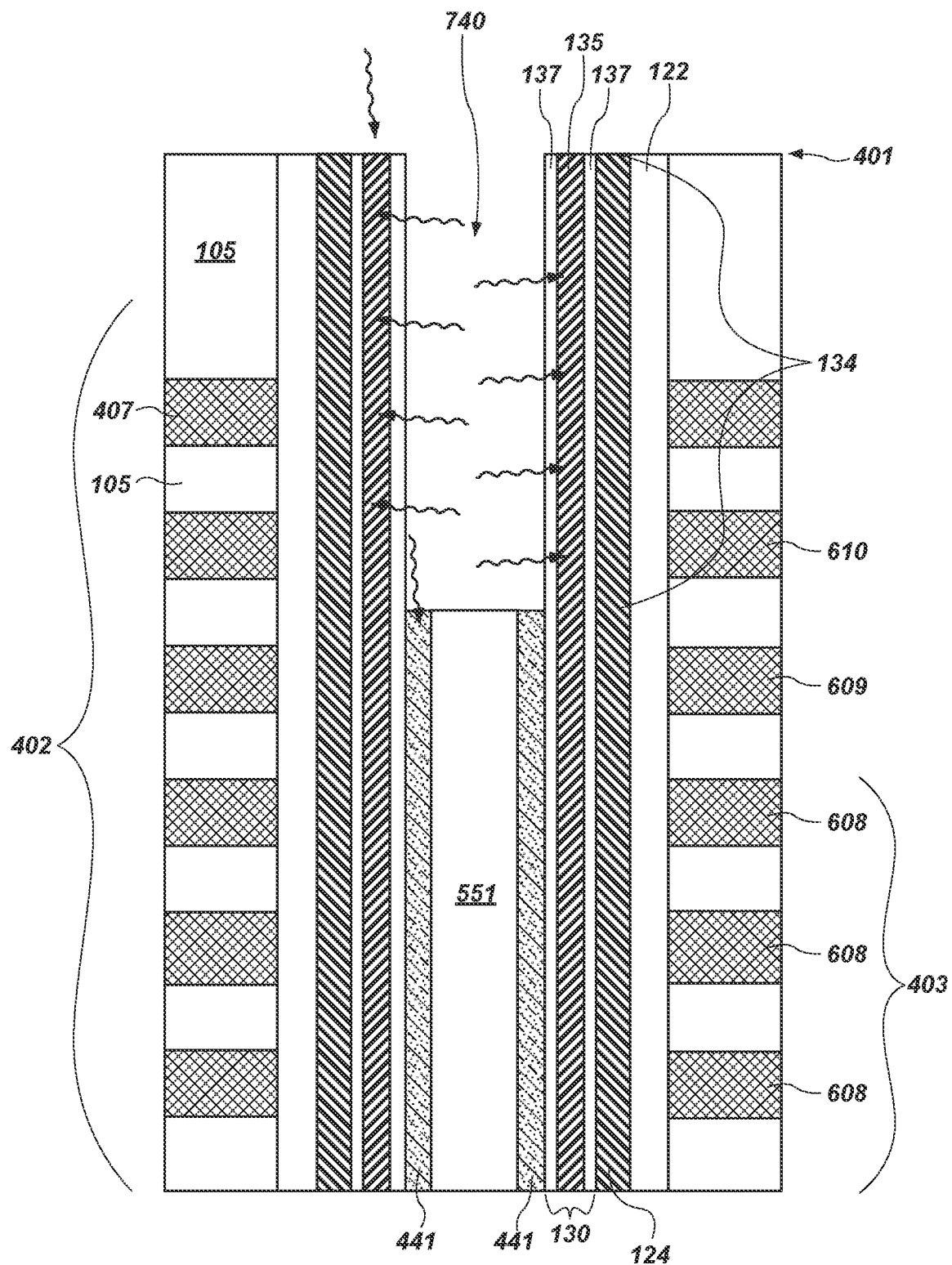

With reference to FIG. 8, an oxidizing environment (represented by squiggly arrows), may be introduced, in an aggressive thermal oxidation process, to oxidize the high-κ material 135 through the innermost sub-structure of the oxide-only material 137 (e.g., through the second oxide layer), along the second tunneling structure 134, at the elevations of the tier(s) 610 that will become the select gate tier(s) 110 (FIG. 1). For example, and without limitation, the aggressive thermal oxidation process may be a remote plasma oxidation (RPO) process. The oxidizing environment may comprise ionized or radicalized species comprising oxygen. Using an aggressive thermal oxidation process, oxygen ions or radicals pass through the innermost sub-structure of the oxide-only material 137 (e.g., through the second oxide layer) and oxidize the high-κ material 135 laterally adjacent the opening 740.

Figure 9:
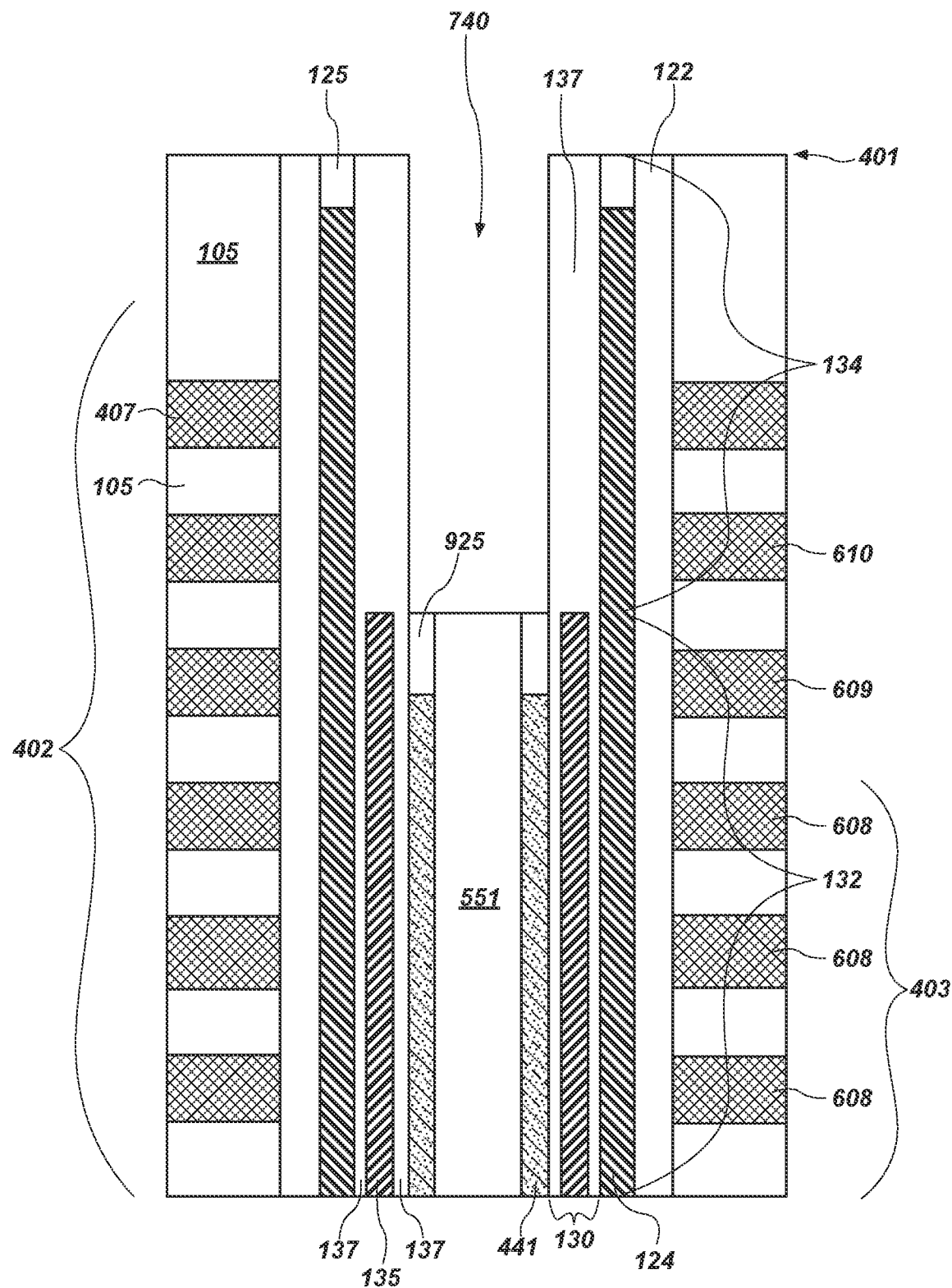

With reference to FIG. 9, as a result of the aggressive thermal oxidation process, the second tunneling structure 134 is converted into an oxide-only structure, consisting essentially of or consisting of the oxide-only material 137, while the first tunneling structure 132 continues to comprise the original dielectric materials for the tunneling structure 130, e.g., the composite structure (e.g., the composite oxide-high-κ-oxide composite structure) including the high-κ material 135. That is, after the thermal oxidation process, the first tunneling structure 132 continues to comprise at least one material that is not an oxide-only material, while the second tunneling structure 134 consists essentially of or consists of the oxide-only material 137.

The aggressive thermal oxidation process may also oxidize the segment 125 of the charge storage material of the charge trap structure 124. The aggressive thermal oxidation process may also oxidize an upper segment 925 of the channel material 441. In embodiments in which the channel material 441 comprises polysilicon, the upper segment 925 may comprise silicon dioxide ($SiO_2$).

Figure 10:
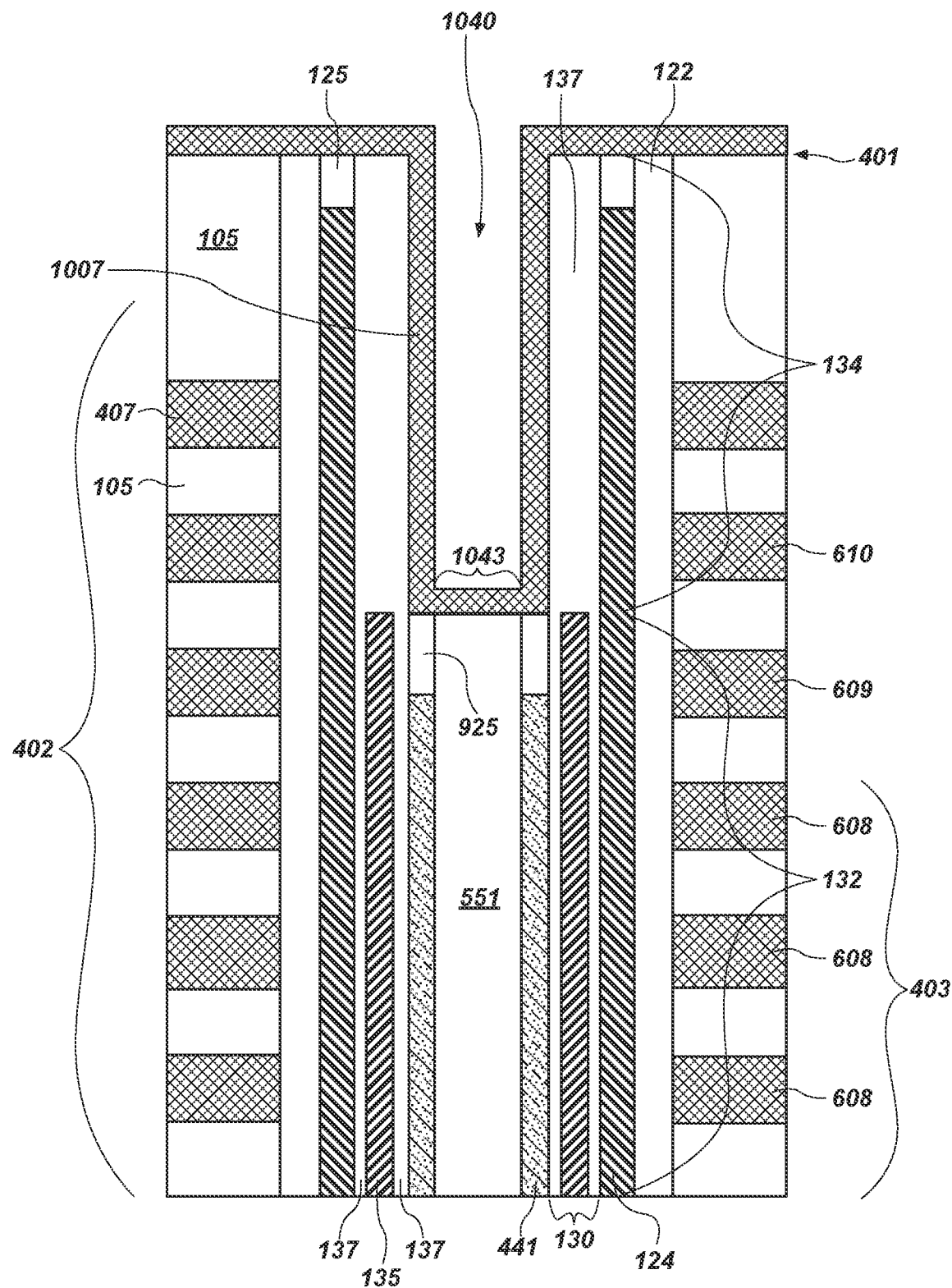

With reference to FIG. 10, a sacrificial material 1007 may be formed (e.g., conformally deposited) on the upper surface 401 and in the opening 740 (FIG. 9), forming a liner that defines an opening 1040 along what will become the second tunneling structure 134. In some embodiments, the sacrificial material 1007 may be a semiconductor material (e.g., a polysilicon material), such as the same material as the channel material 441.

Figure 11:
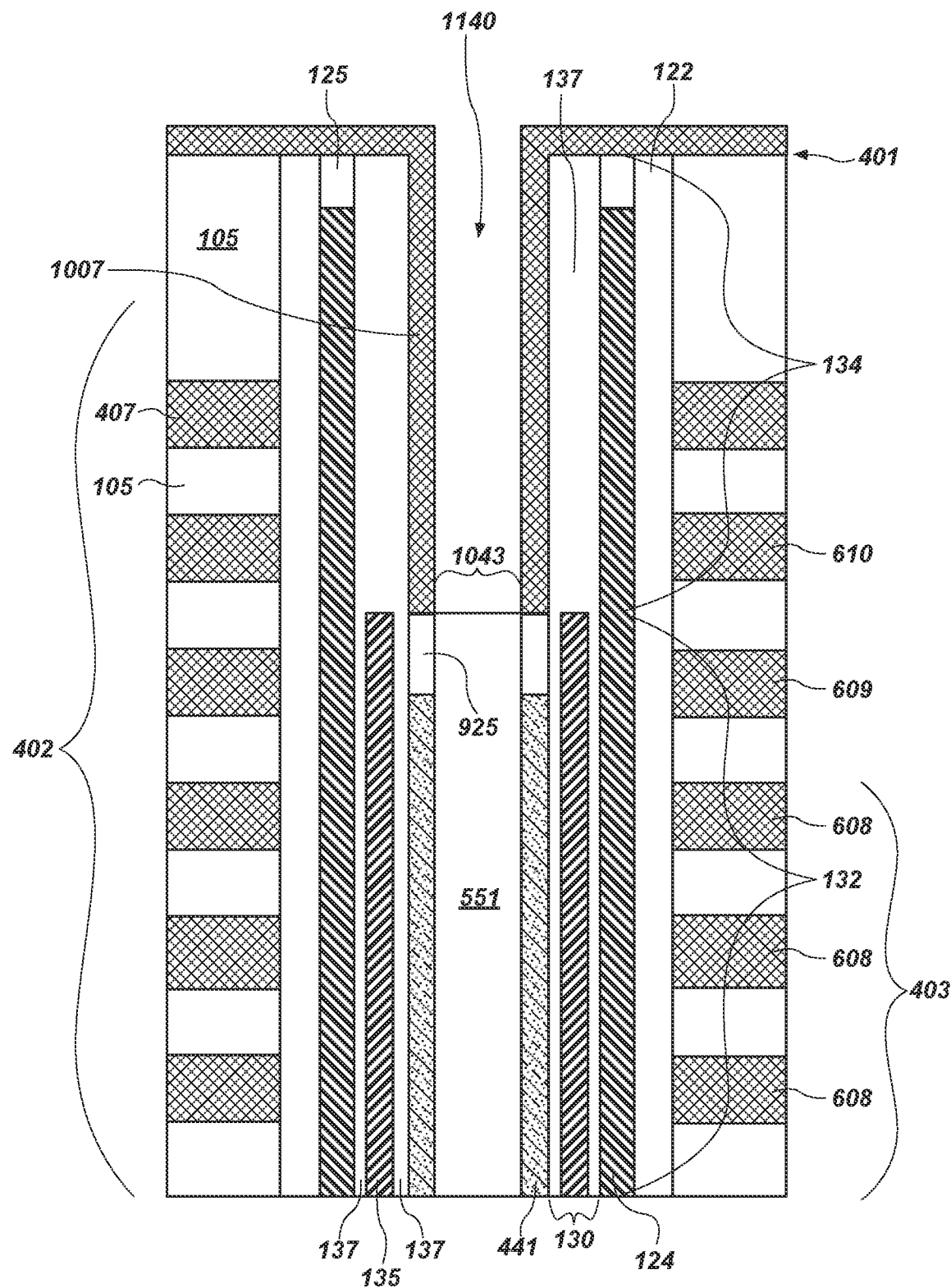
Figure 12:
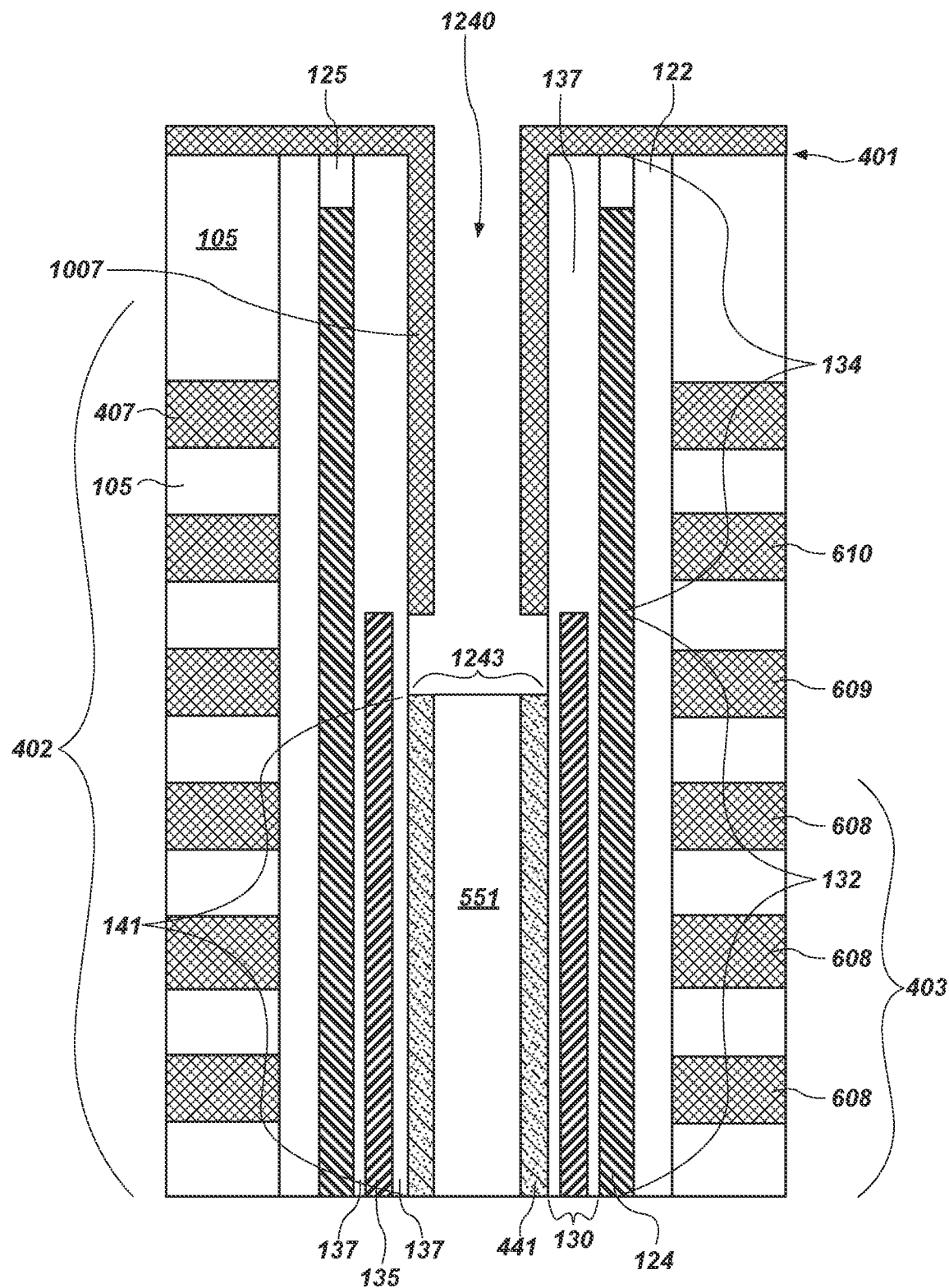

A portion 1043 of the sacrificial material 1007 may be directly on and cover the dielectric material 551 and the upper segments 925. With reference to FIG. 11, the portion 1043 (e.g., the lowermost portion) of the sacrificial material 1007 may be removed (e.g., by etching (e.g., anisotropic etching)) to expose the uppermost surface of the dielectric material 551 in opening 1140.

An isotropic removal process (e.g., an isotropic etch (e.g., a light Buffered Oxide Etch (BOE))), formulated and configured to be selective for oxide material, may be conducted to remove exposed oxide material, namely the uppermost portion of the dielectric material 551 that was exposed along portion 1043. As the dielectric material 551 along portion 1043 is removed, the upper segments 925, also oxide material, are exposed and also removed. Thus, with reference to FIG. 12, the isotropic removal process exposes an upper surface of the channel material 441 as well as an upper surface of the dielectric material 551 along portion 1243 in opening 1240. A sidewall portion of the innermost substructure of the tunneling structure 130 materials, namely, the oxide-only material 137 (e.g., of the second oxide layer of the oxide-high-κ-oxide composite structure), may also be exposed in the opening 1240.

During the isotropic removal process, the sacrificial material 1007 serves as a protective liner, inhibiting removal of the oxide-only material 137 along the second tunneling structure 134.

The isotropic removal process recesses the dielectric material 551 to an elevation lower than an uppermost elevation of the high-κ material 135. An uppermost surface of the channel material 441 is likewise recessed. In some embodiments, the channel material 441 may be recessed to an elevation still higher than the uppermost surface of the dielectric material 551. Thus, formed is the first channel structure 141.

Figure 13:
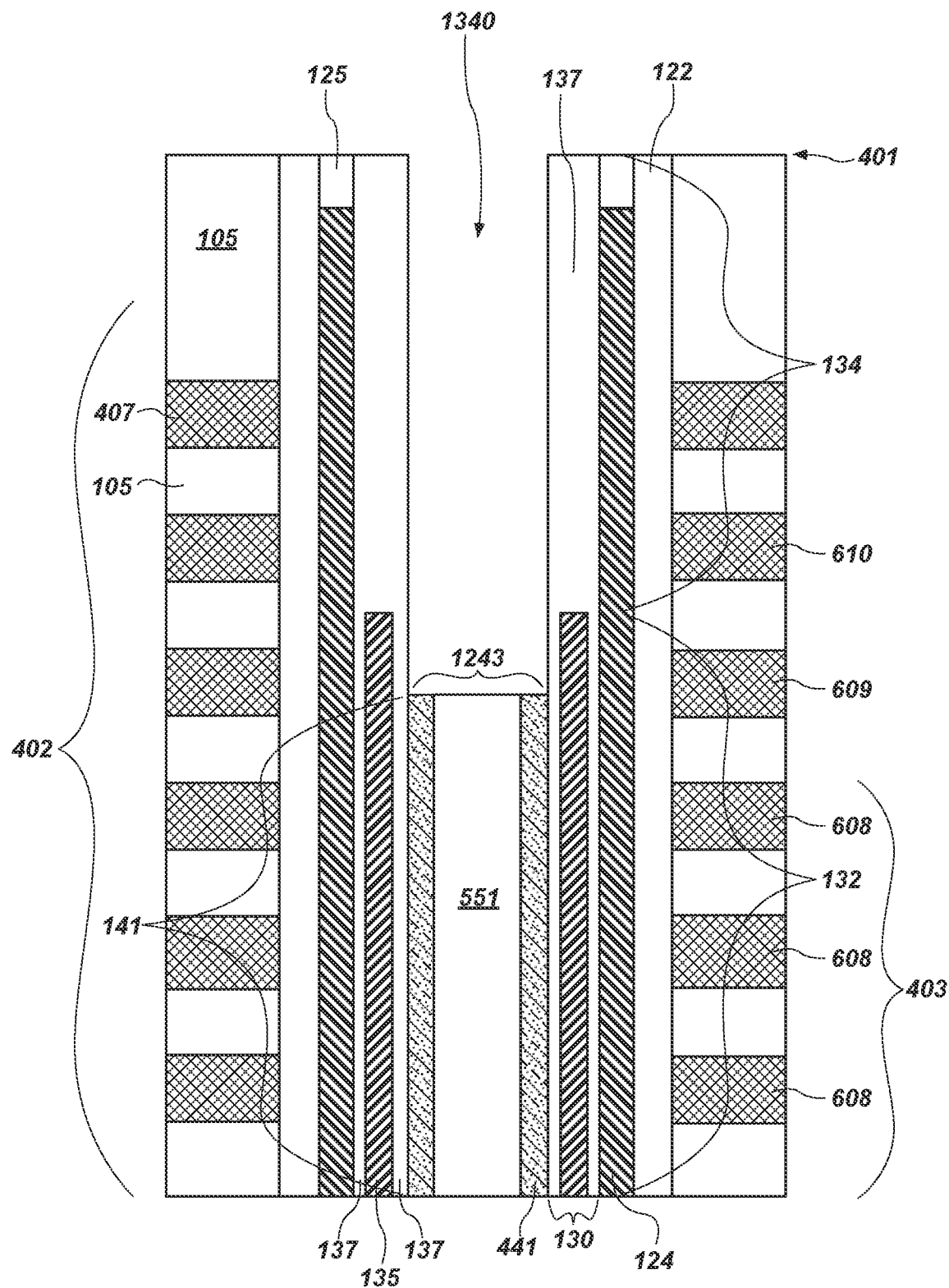

With reference to FIG. 13, the sacrificial material 1007 may then be removed (e.g., by etching (e.g., by wet etching)), leaving the uppermost surface of the channel material 441 exposed in opening 1340.

Figure 14:
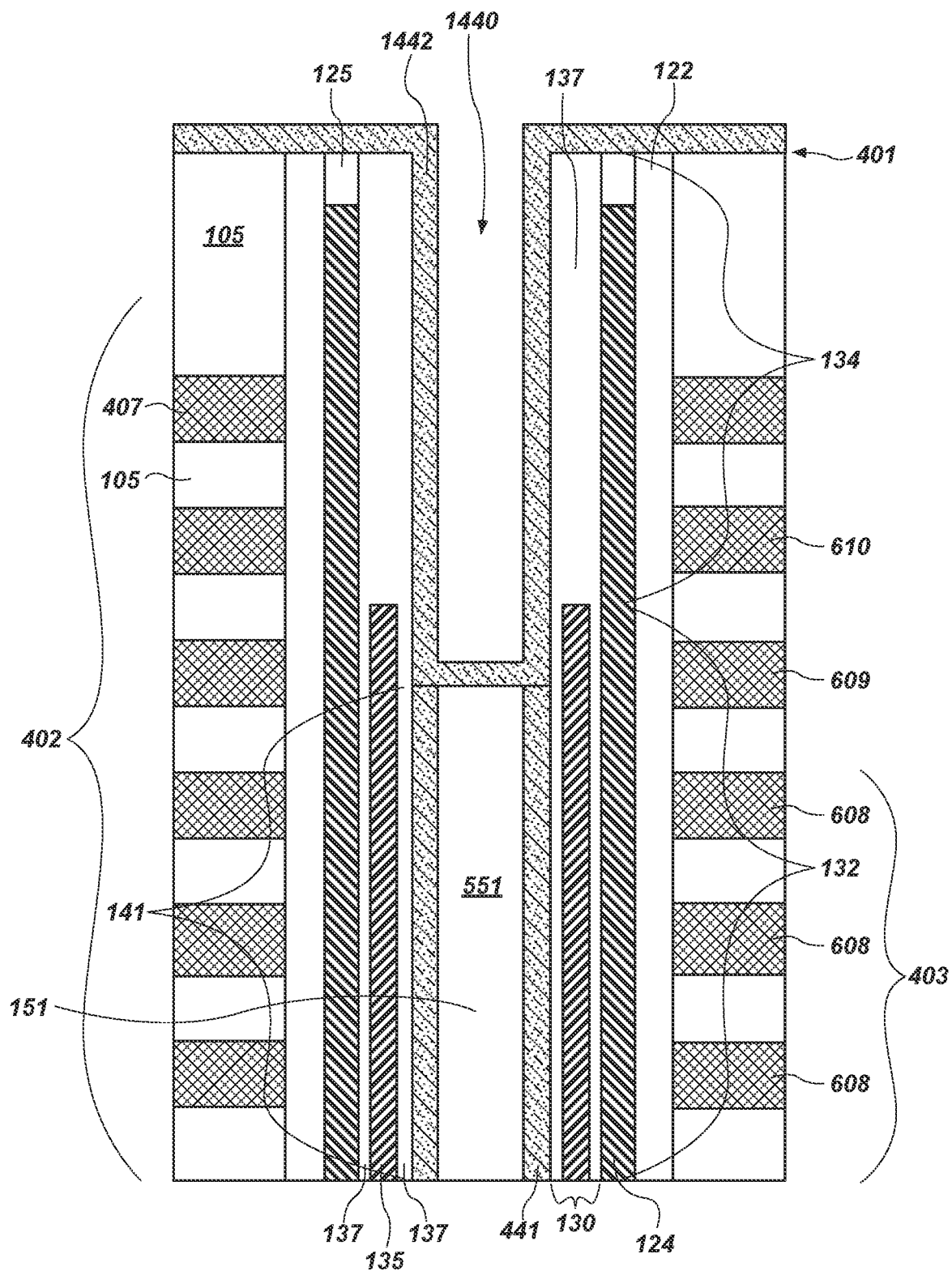

With reference to FIG. 14, another channel material 1442 (e.g., a semiconductor material (e.g., a polysilicon)) may be formed (e.g., conformally deposited) on the upper surface 401 and in the opening 1340 (FIG. 13), to provide opening 1440. In some embodiments, the other channel material 1442 may have the same composition as the channel material 441 of the first channel structure 141.

The other channel material 1442 is formed in direct physical contact with an uppermost surface of the channel material 441 of the first channel structure 141, bringing the channel material 441 and the other channel material 1442 into electrical contact with one another.

The other channel material 1442 may be formed to fully cover the uppermost surface of the dielectric material 551, and this bottommost portion of the other channel material 1442 may remain during subsequent processing and be included in the final structure (e.g., apparatus structure 100 of FIG. 1). In other embodiments (e.g., consistent with that illustrated in FIG. 3C), the lowermost portion of the other channel material 1442 may be removed (e.g., anisotropically etched) to expose the uppermost surface of the dielectric material 551. Even in such embodiments, however, the channel material 441 of the first channel structure 141 remains in direct physical contact with the other channel material 1442.

Figure 15:
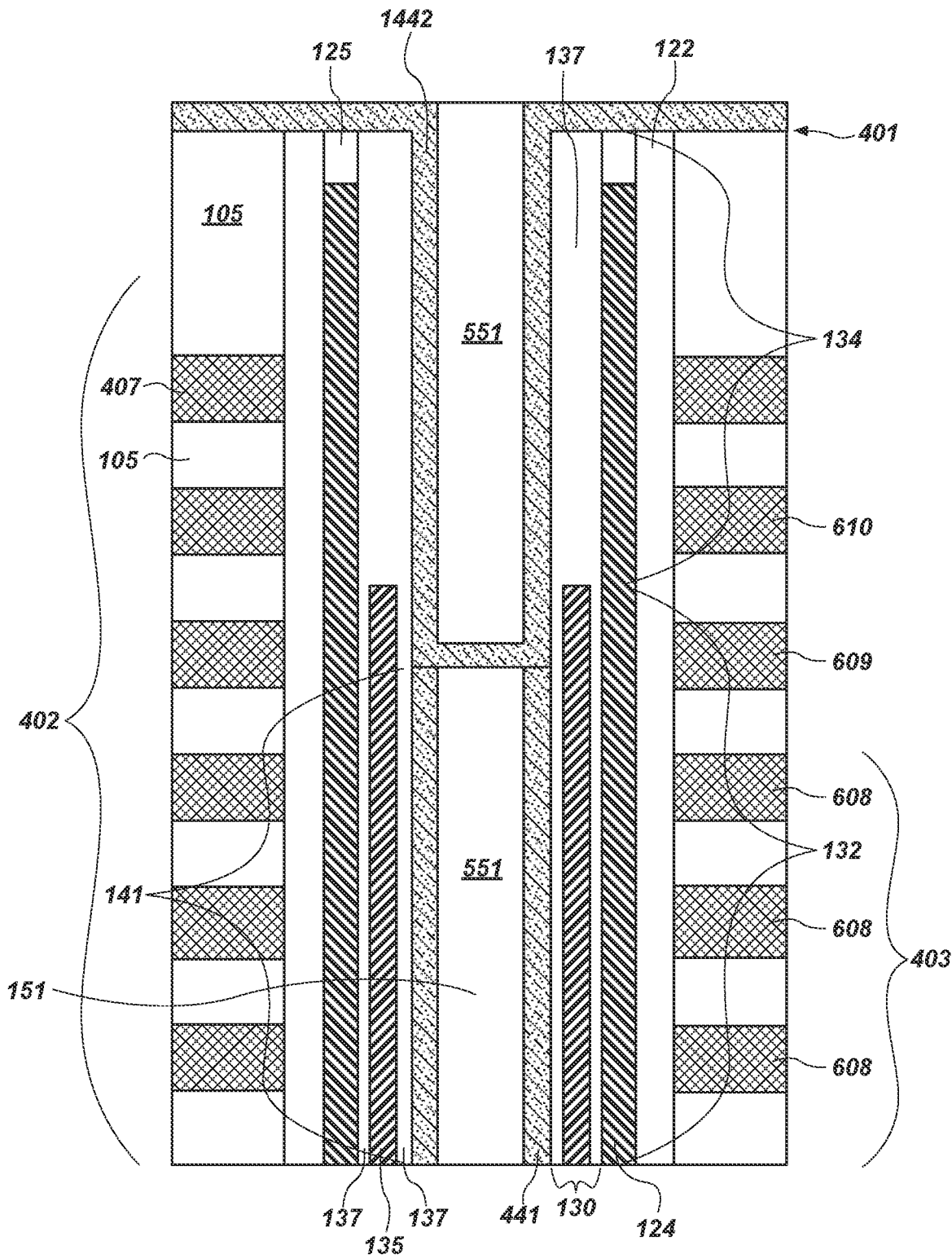

Remaining opening 1440, defined by the other channel material 1442, may then be filled by another portion of the dielectric material 551, as illustrated in FIG. 15. For example, another portion of the dielectric material 551 (which may have the same or a different composition as the dielectric material 551 central to the first channel structure 141) may be formed (e.g., deposited) to fill opening 1440 (FIG. 14). In some embodiments, a planarization (e.g., by chemical mechanical processing (CMP)) be performed to remove any overfilled amounts of the dielectric material 551, exposing an uppermost surface of the other channel material 1442 on the upper surface 401 of the intermediate structure of FIG. 15.

In embodiments in which the lowermost, horizontally-extending portion of the other channel material 1442 has been removed prior to forming the other portion of the dielectric material 551, the other portion of the dielectric material 551 may be formed directly on the dielectric material 551 within the first channel structure 141, consistent with the embodiment illustrated in FIG. 3C.

Figure 16:
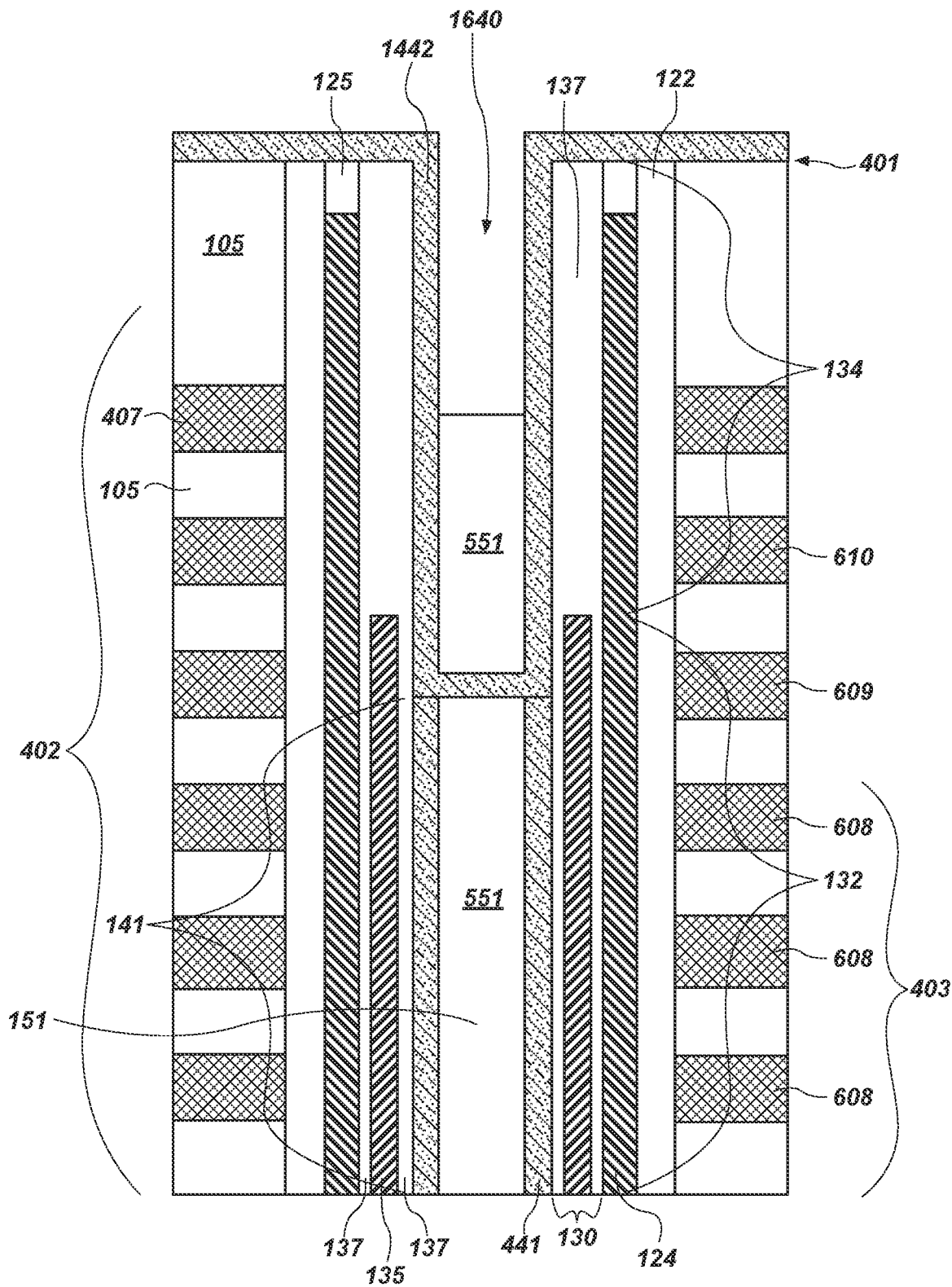

With reference to FIG. 16, an uppermost portion of the dielectric material 551 within the other channel material 1442 may then be removed (e.g., etched) to recess an uppermost surface of the dielectric material 551 to an elevation still higher than the tier(s) 610 that will eventually become the select gate tier(s) 110 (FIG. 1), defining opening 1640. The recessed elevation may be tailored to the performance needs of the electronic apparatus being formed.

Figure 17:
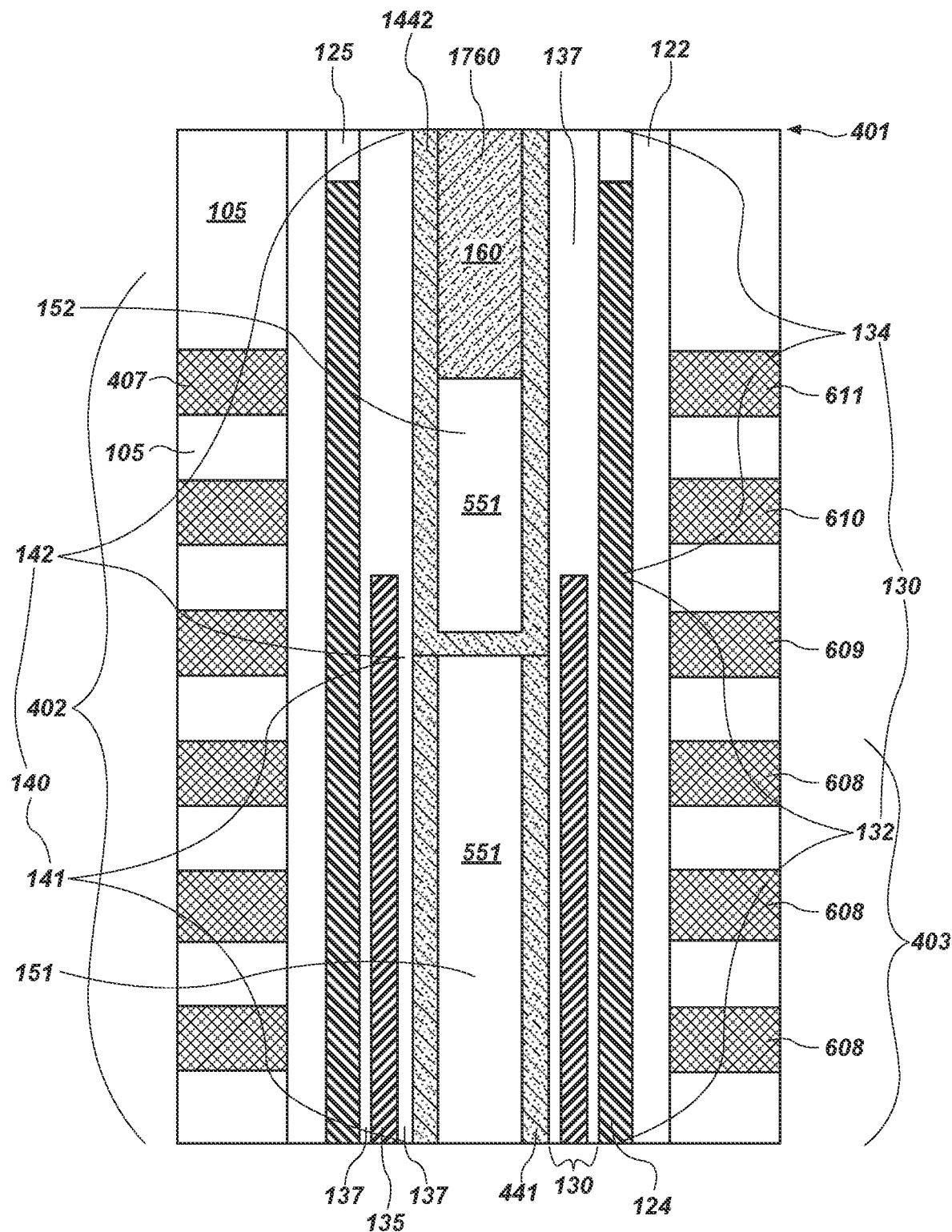

With reference to FIG. 17, a polysilicon material 1760 may be formed (e.g., deposited) to fill the opening 1640 (FIG. 16), and then the intermediate structure subjected to planarization to remove the portions of the other channel material 1442 from the upper surface 401. Thus, the channel material 1442 is electrically isolated from channel material of neighboring vertical structures.

In embodiments in which the other material 407 is a sacrificial material, subsequent processing may use conventional methods to remove the other material 407 in the tiered material structure 402 and replace it with the conductive material 107 to form the word line tiers 108 (FIG. 1) in tiers 608 of the material stack 403, the dummy word line tier(s) 109 (FIG. 1) in tier(s) 609, the select gate tier(s) 110 (FIG. 1) in tier(s) 610, and the GIDL generator tier 111 (FIG. 1) in tier 611, forming the apparatus structure 100 of FIG. 1. The removal of the other material 407 may be conducted by a so-called "replacement gate" process, and the resulting conductive tiers 106 of the apparatus structure 100 (e.g., the word line tiers 108, the dummy word line tier(s) 109, the select gate tier(s) 110, the GIDL generator tier 111, etc.) may be configured as "replacement gates." In other embodiments, such as those in which the other material 407 is not sacrificial but is initially formed as the conductive material 107, the other material 407 may not be removed or replaced. The resulting conductive tiers 106 of the apparatus structure 100 (e.g., the word line tiers 108, the dummy word line tier(s) 109, the select gate tier(s) 110, the GIDL generator tier 111, etc.) may nonetheless be configured as control gates of the apparatus structure 100.

Figure 3A:
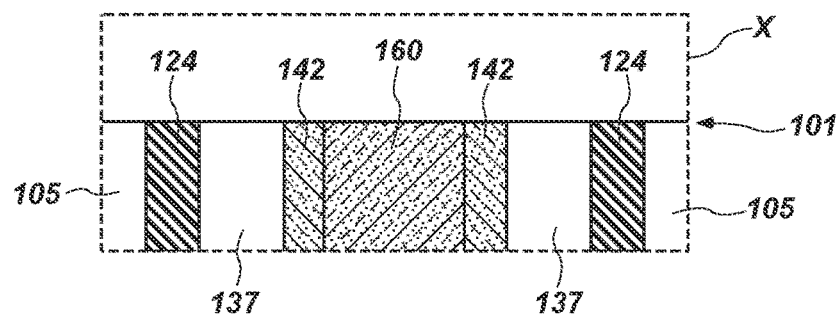
FIG. 3A is an enlarged view of Box X of FIG. 1, schematically illustrating embodiments of the disclosure, wherein a charge trap structure, of the apparatus structure of FIG. 1, extends to an upper surface of the apparatus structure.
Figure 3B:
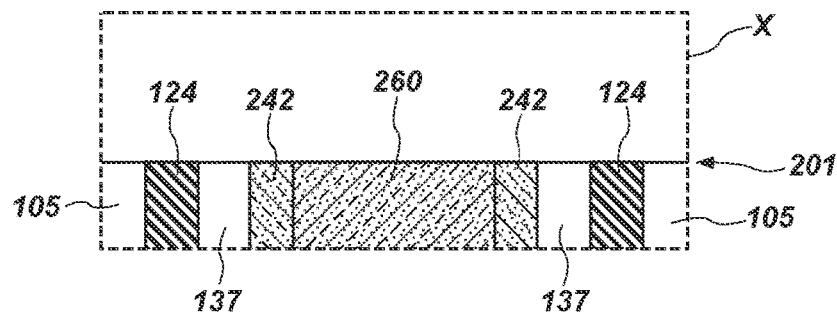
FIG. 3B is an enlarged view of Box X of FIG. 2, schematically illustrating embodiments the disclosure, wherein a charge trap structure, of the apparatus structure of FIG. 2, extends to an upper surface of the apparatus structure.
Figure 3C:
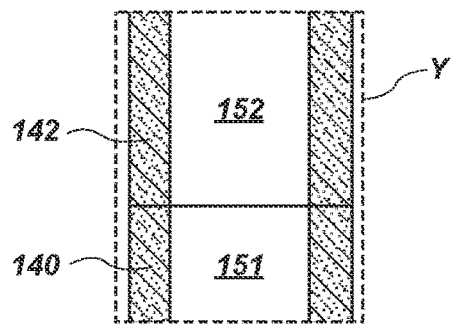
FIG. 3C is an enlarged view of Box Y of FIG. 1, schematically illustrating embodiments of the disclosure, wherein first and second fill structures of a dielectric fill structure, of the apparatus structure of FIG. 1, are in direct physical contact with one another.
Figure 3D:
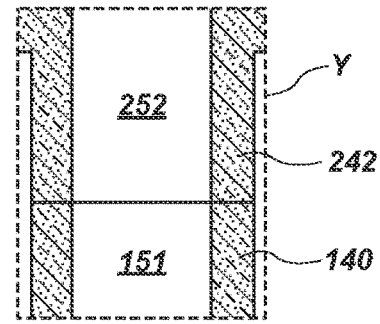
FIG. 3D is an enlarged view of Box Y of FIG. 2, schematically illustrating embodiments of the disclosure, wherein first and second fill structures of a dielectric fill structure, of the apparatus structure of FIG. 2, are in direct physical contact with one another.
Figure 3E:
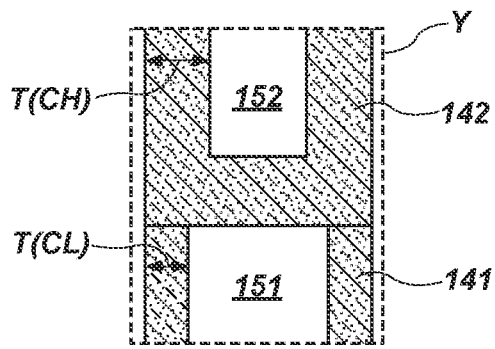
FIG. 3E is an enlarged view of Box Y of FIG. 1, schematically illustrating embodiments of the disclosure, wherein a channel structure, of the apparatus structure of FIG. 1, includes a first channel structure with a channel material having a lesser thickness than that of the channel material of a second channel structure.
Figure 3F:
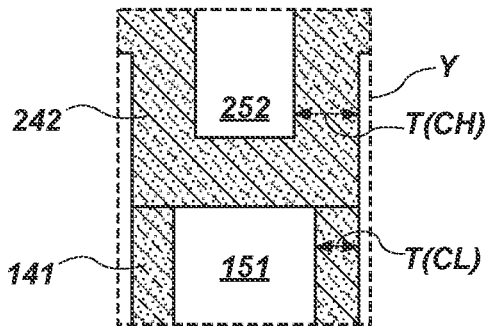
FIG. 3F is an enlarged view of Box Y of FIG. 2, schematically illustrating embodiments of the disclosure, wherein a channel structure, of the apparatus structure of FIG. 2, includes a first channel structure with a channel material having a lesser thickness than that of the channel material of a second channel structure.
Figure 3G:
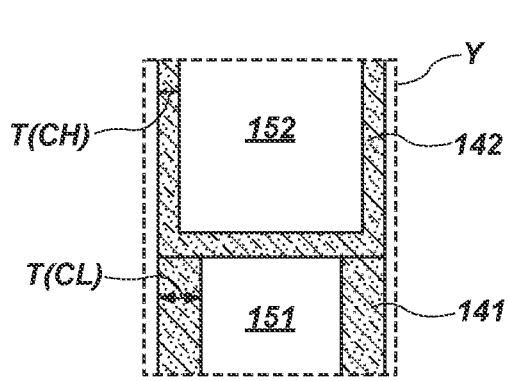
FIG. 3G is an enlarged view of Box Y of FIG. 1, schematically illustrating embodiments of the disclosure, wherein a channel structure, of the apparatus structure of FIG. 1, includes a first channel structure with a channel material having a greater thickness than that of the channel material of a second channel structure.
Figure 3H:
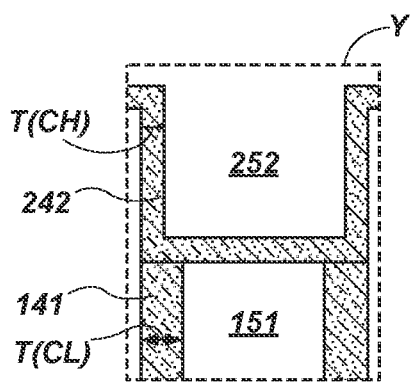
FIG. 3H is an enlarged view of Box Y of FIG. 2, schematically illustrating embodiments of the disclosure, wherein a channel structure, of the apparatus structure of FIG. 2, includes a first channel structure with a channel material having a greater thickness than that of the channel material of a second channel structure.
Figure 3I:
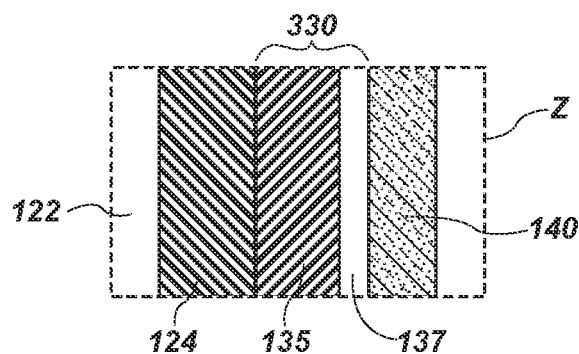
FIG. 3I is an enlarged view of Box Z of FIG. 1 and/or of FIG. 2, schematically illustrating embodiments of the disclosure, wherein a high-κ material of the first tunneling structure is directly adjacent a charge trap structure.

In some embodiments, after or while removing the uppermost portions of the other channel material 1442 to expose the upper surface 401, as illustrated in FIG. 17, the segment 125 of the oxidized portions of the charge storage material of the charge trap structure 124 may be removed (e.g., etched)—and, in some embodiments, replaced with the charge storage material of the charge trap structure 124—so that the charge trap structure 124 has a consistent composition along the height of the vertical structure 120 (FIG. 1), consistent with the embodiment illustrated in FIG. 3A.

Accordingly, disclosed is a method of forming a semiconductor device. The method comprises forming an opening extending through a tiered material structure comprising insulative material interleaved with another material. A charge-blocking material is formed in the opening along a sidewall of the tiered material structure. A charge storage material is formed in the opening along a sidewall of the charge-blocking material. A tunneling structure is formed in the opening along a sidewall of the charge storage material. The tunneling structure comprises a layer of a high-κ material. The method also comprises oxidizing only a portion of the high-κ material to convert the portion of the high-κ material into an oxide.

As discussed above, the method of FIGS. 4 through 17 includes forming the sacrificial material 1007 (FIG. 12) for use as a liner when exposing an uppermost surface of the channel material 441 of the first channel structure 141, and then removing the sacrificial material 1007. However, in other embodiments, such as that of FIGS. 18 through 21, the liner may not be sacrificial, but may remain in the final structure.

Figure 18:
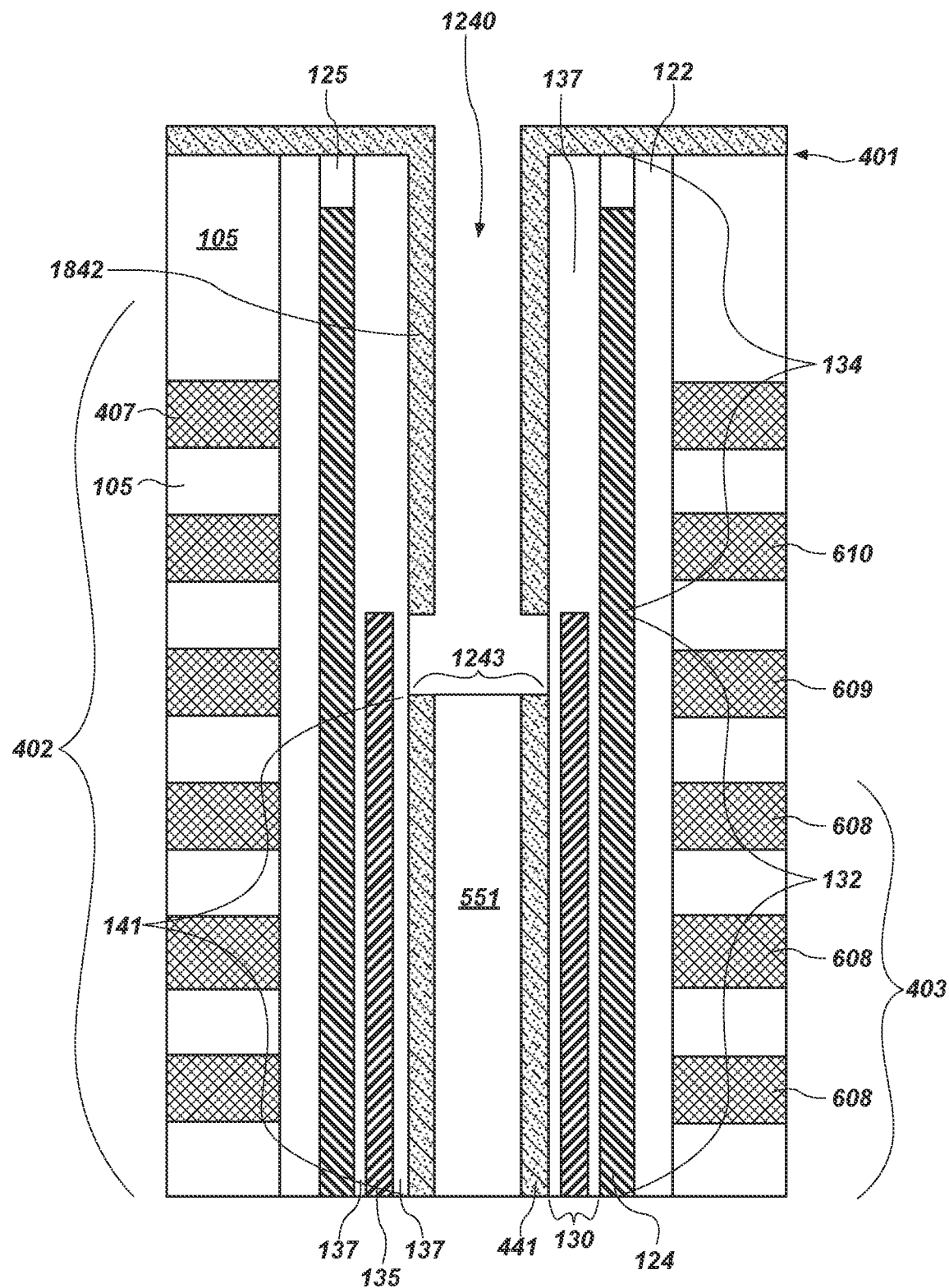
FIGS. 18 through 21 are—in conjunction with FIGS. 4 through 9—cross-sectional, elevational, schematic illustrations during various stages of processing to fabricate the apparatus structure of FIG. 21, according to embodiments of the disclosure, wherein FIG. 18 follows the stage illustrated in FIG. 9.

For example, after the stage of FIG. 9 and with reference then to FIG. 18, an intermediate channel material 1842 may be formed (e.g., in the same manner as forming the sacrificial material 1007 (FIG. 10)). The intermediate channel material 1842 may have the same or different composition than the channel material 441 of the first channel structure 141. The stages of FIGS. 11 and 12 may then be performed to form the opening 1240 that exposes portion 1243, including the uppermost surface of the channel material 441 of the first channel structure 141, while the intermediate channel material 1842 covers the oxide-only material 137 of the second tunneling structure 134, inhibiting its removal.

Figure 19:
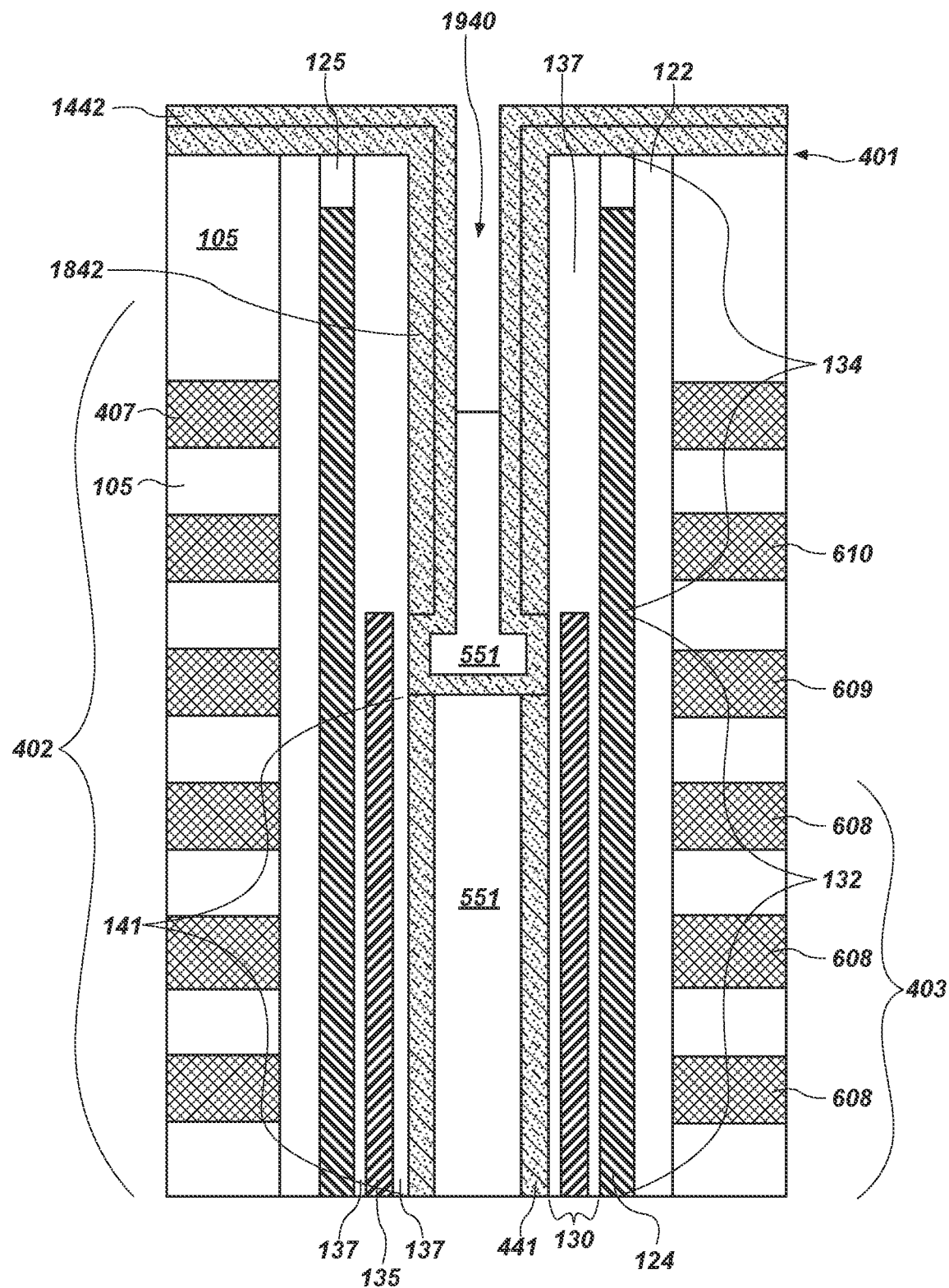

With reference to FIG. 19, the other channel material 1442 may then be formed (e.g., conformally deposited) on the intermediate channel material 1842 and in direct physical contact with the exposed uppermost surface of the channel material 441 of the first channel structure 141. Similarly to the stage of FIGS. 15 and 16, the dielectric material 551 may be formed (e.g., deposited) within an opening defined by the other channel material 1442 and then recessed to the recess elevation above that of tier 610, leaving opening 1940, as illustrated in FIG. 19. Thus, with reference to FIG. 20, formed is a dielectric fill structure 2050 with the first fill structure 151 and a second fill structure 2052. Therefore, the dielectric material 551 may comprise a greater horizontal (e.g., transverse) outer dimension adjacent the non-oxidized, uppermost portion of the high-κ material 135 of the first tunneling structure 132, than at elevations above the high-κ material 135 (e.g., at elevations of the second tunneling structure 134).

Figure 20:
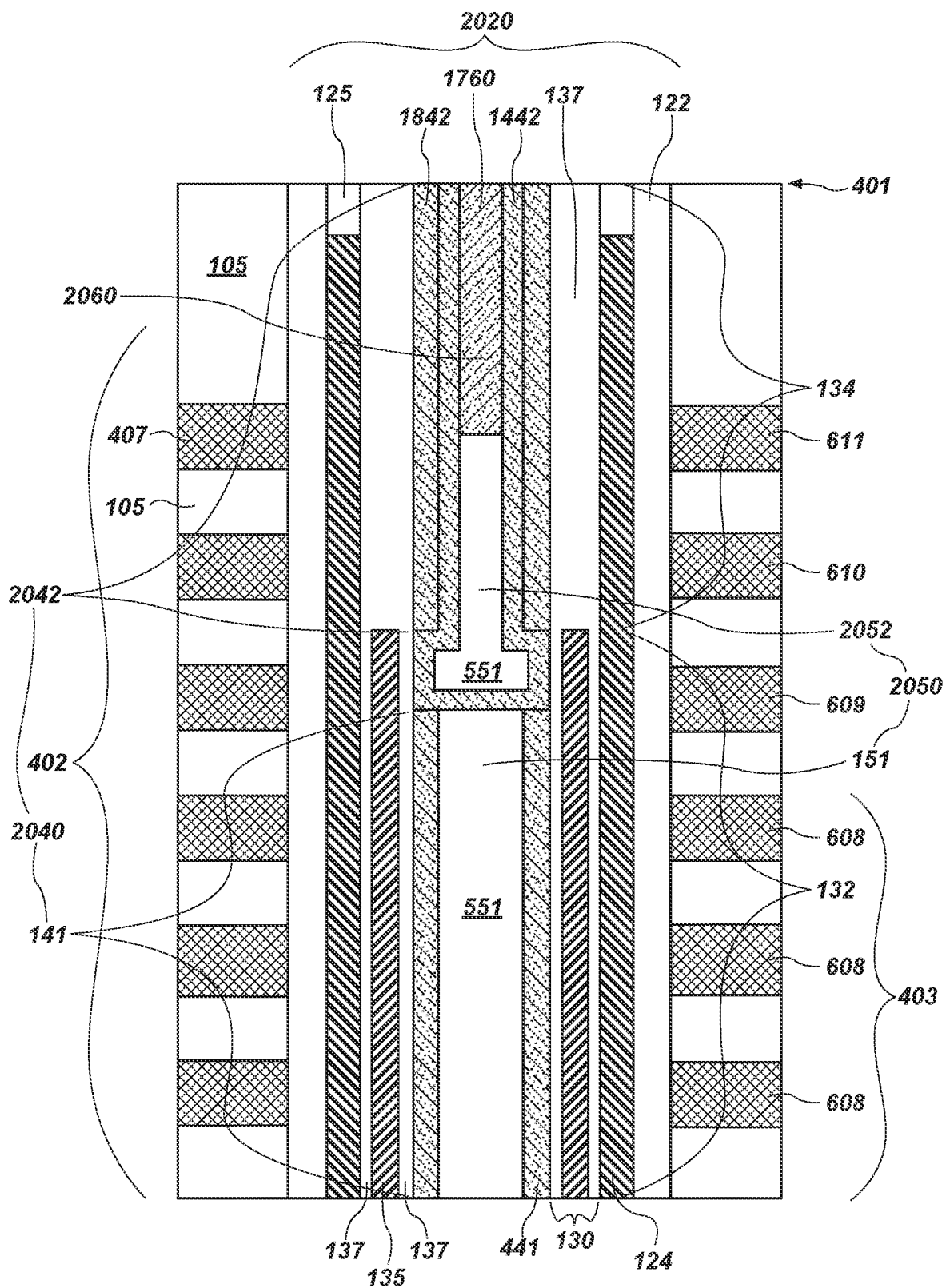

The polysilicon material 1760 may then be formed (e.g., deposited) to fill (and, optionally, overfill) the opening 1940 (FIG. 19), as illustrated in FIG. 20. The uppermost portions of the intermediate channel material 1842 and the other channel material 1442 may be removed (e.g., along with overfill amounts, if any, of the polysilicon material 1760) to expose the upper surface 401 and electrically isolate the material of a resulting channel structure 2040, which channel structure 2040 includes the first channel structure 141 formed from the channel material 441 and a second channel structure 2042 formed from the intermediate channel material 1842 and the other channel material 1442. A plug 2060 (e.g., a conductive plug) of a vertical structure 2020 is formed from the polysilicon material 1760, adjacent the upper surface 401.

Figure 21:
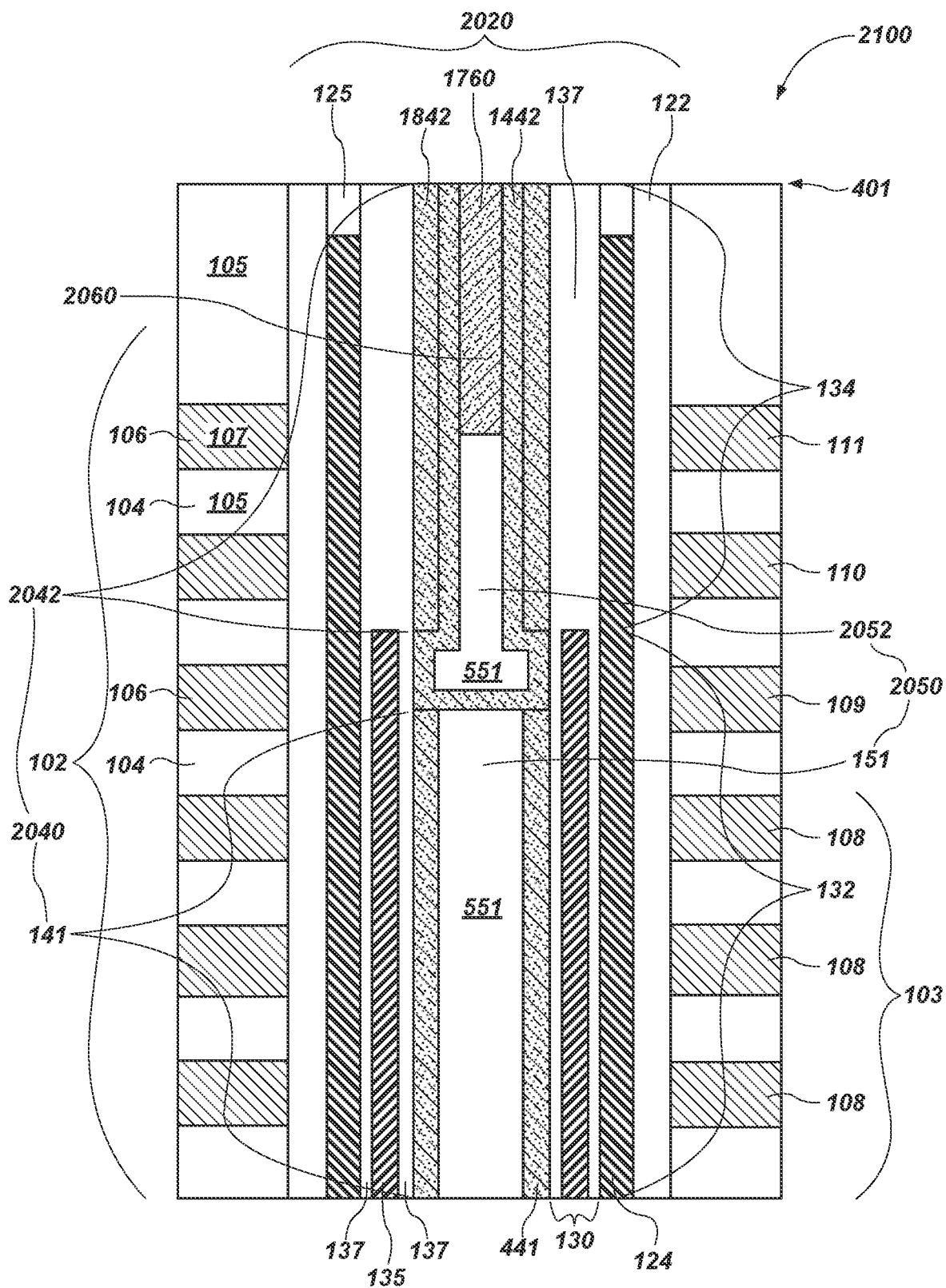

In embodiments in which the other material 407 is a sacrificial material, the other material 407 of the tiered material structure 402 may be removed and the conductive material 107 may be formed as a replacement, as illustrated in FIG. 21, to form a structure 2100 (which may also be referred to herein as an "apparatus structure" 2100) including the tiered structure 102 of the insulative tiers 104 of the insulative material 105 and the conductive tiers 106 of the conductive material 107. The stack 103 of the apparatus structure 2100 includes the word line tiers 108. Over the stack 103 are the dummy word line tier(s) 109, the select gate tier(s) 110, and the GIDL generator tier(s) 111. Thus, the conductive tiers 106 may include "replacement gates." In embodiments in which the other material 407 is not a sacrificial material but is, instead, formed as the conductive material 107, the other material 407 may not be removed or replaced. Nonetheless, the word line tiers 108, the dummy word line tier(s) 109, the select gate tier(s) 110, and the GIDL generator tier(s) 111 may be control gates formed from the other material 407. The apparatus structure 2100 may be used in an electronic apparatus just as the apparatus structure 100 of FIG. 1.

Figure 22:
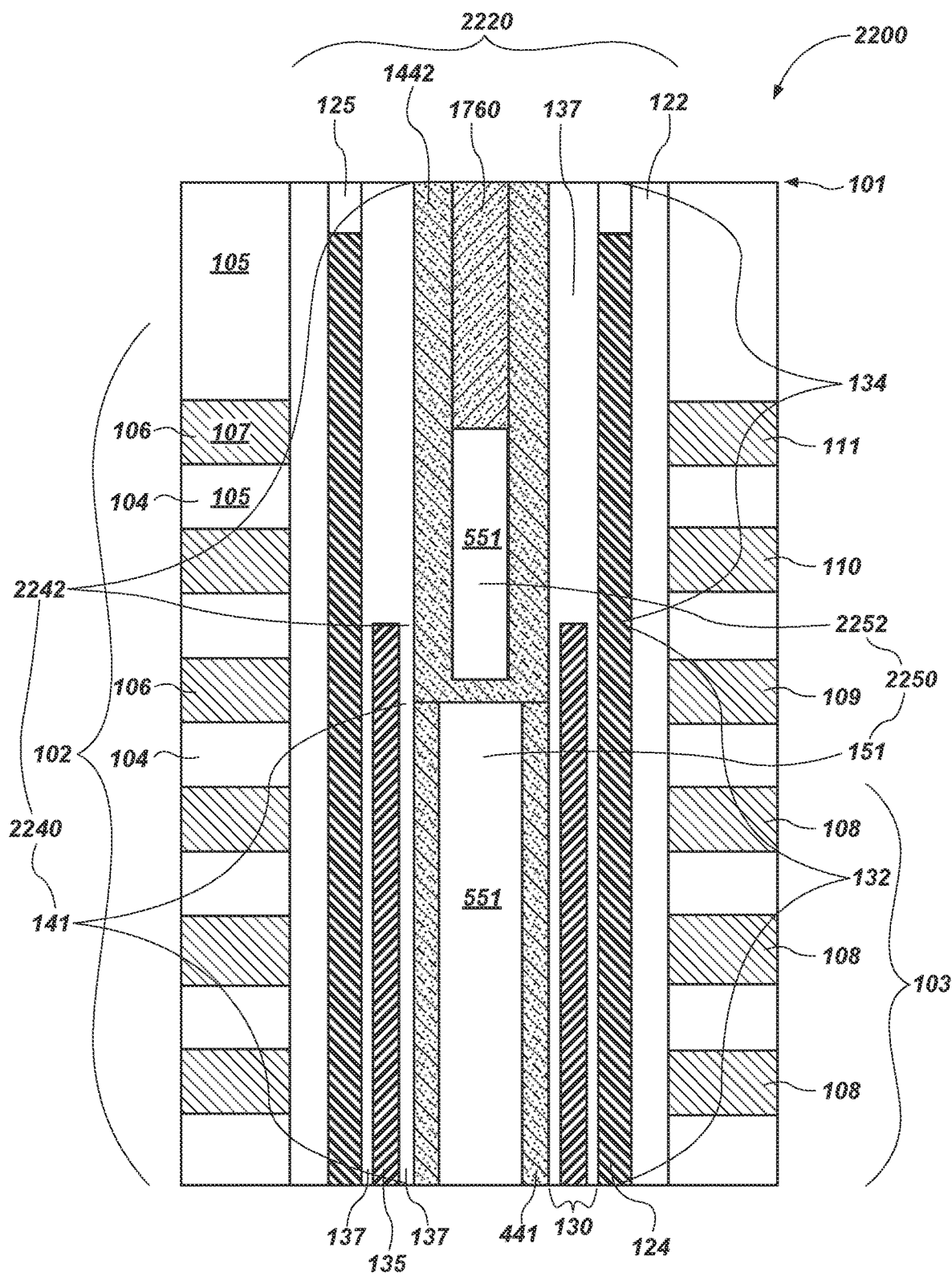
FIG. 22 is a cross-sectional, elevational, schematic illustration of an apparatus structure for an array of storage devices with a 3D NAND architecture, consistent with the embodiment of FIG. 3E, wherein the apparatus structure includes a tunneling structure with a first tunneling structure having a thickness substantially equal to a thickness of a second tunneling structure, the apparatus structure also including a first channel structure with a channel material having a lesser thickness than that of the channel material of a second channel structure.

Methods of the disclosure enable tailoring of the thickness of a channel structure adjacent a select gate tier independently of a thickness of the channel structure adjacent word line tiers. For example, in some embodiments, when forming the other channel material 1442 (FIG. 14) along the second tunneling structure 134 (as described above with respect to FIG. 14), the other channel material 1442 may be formed to a greater thickness than a thickness of the channel material 441 of the first channel structure 141, as illustrated in FIG. 22. (See also, FIG. 3E and T(CH) relative to T(CL) therein.) Completing the fabrication process (e.g., such as by the stages of FIGS. 15 through 17 and then, in embodiments in which the other material 407 is a sacrificial material, replacement of the other material 407 (FIG. 17) with the conductive material 107) forms an apparatus structure 2200 comprising a vertical structure 2220 with the tunneling structure 130 including the second tunneling structure 134 as the oxide-only structure consisting of the oxide-only material 137 and with the tunneling structure 130 also including the first tunneling structure 132 as the composite structure of multiple dielectric materials (including the high-κ material 135); a channel structure 2240 with the first channel structure 141 of the channel material 441 comprising a first thickness (e.g., T(CL) of FIG. 3E) and with an second channel structure 2242 of the other channel material 1442 comprising a second thickness (e.g., T(CH) of FIG. 3E) greater than the first thickness; and a dielectric fill structure 2250 with the first fill structure 151 within the first channel structure 141 and with an second fill structure 2252 within the second channel structure 142 adjacent the select gate tier(s) 110.

Figure 23:
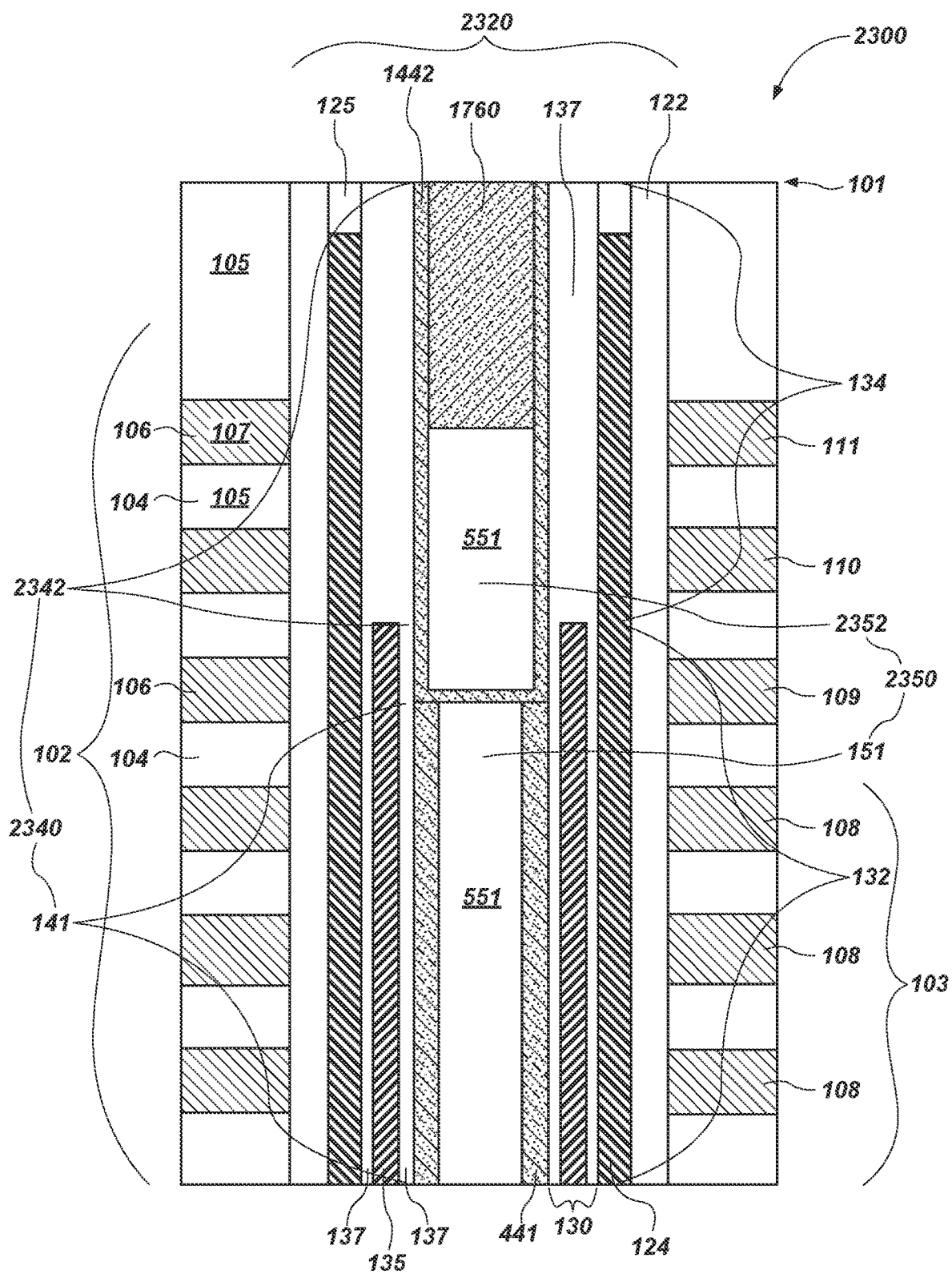
FIG. 23 is a cross-sectional, elevational, schematic illustration of an apparatus structure for an array of storage devices with a 3D NAND architecture, consistent with the embodiment of FIG. 3G, wherein the apparatus structure includes a tunneling structure with a first tunneling structure having a thickness substantially equal to a thickness of a second tunneling structure, the apparatus structure also including a first channel structure with a channel material having a greater thickness than that of the channel material of a second channel structure.

In other embodiments, with reference to FIG. 23, when forming the other channel material 1442 along the second tunneling structure 134 (as described above with respect to FIG. 14), the other channel material 1442 may be formed to a lesser thickness than a thickness of the channel material 441 of the first channel structure 141. (See also, FIG. 3G and T(CH) relative to T(CL) therein.) Completing the fabrication process (e.g., such as by the stages of FIGS. 15 through 17—and then, in embodiments in which the other material 407 (FIG. 17) is a sacrificial material, replacement of the other material 407 (FIG. 17) with the conductive material 107)—forms an apparatus structure 2300 comprising a vertical structure 2320 that includes a channel structure 2340 with the first channel structure 141 of the channel material 441 comprising a first thickness (e.g., T(CL) of FIG. 3G) and with an second channel structure 2342 of the other channel material 1442 comprising a second thickness (e.g., T(CH) of FIG. 3G) less than the first thickness; and a dielectric fill structure 2350 with the first fill structure 151 within the first channel structure 141 and with an second fill structure 2352 within the second channel structure 142 adjacent the select gate tier(s) 110.

Similarly, the thickness of the intermediate channel material 1842 (e.g., per FIG. 18) and the other channel material 1442 (e.g., per FIG. 19) may be tailored in forming a structure like the apparatus structure 2100 of FIG. 21.

While the methods of the embodiments of FIGS. 4 through 23 make use of a liner (e.g., either the sacrificial material 1007 of FIG. 10 or the other intermediate channel material 1842 of FIG. 18) to protect and inhibit removal of the oxide-only material 137 of the second tunneling structure 134 during the isometric removal process exposing the portion 1243, in other embodiments, no protective liner may be used. For example, after converting the high-κ material 135 into the oxide-only material 137 along the second tunneling structure 134, as illustrated in FIGS. 8 and 9, exposed portions of oxide material (see FIG. 9)—whether oxide-only material 137 or other oxide material—may be removed (e.g., etched (e.g., by a light oxide clean)) to form the structure of FIG. 24, with the tunneling structure 230 of different thicknesses along the second tunneling structure 134 compared to the first tunneling structure 132. The removed portions include exposed sidewall portions of the oxide-only material 137, the upper segments 925 (FIG. 9), an upper portion of the dielectric material 551, and, optionally, uppermost portions of the insulative material 105, the charge-blocking structure 122, and the segment 225 of oxidized charge storage material exposed at the upper surface 401. In some such embodiments (e.g., that used to form the structure of FIG. 3B), substantially all of the oxidized material of the segment 225 (e.g., the oxidized portion of the charge trap structure 124) may be removed, exposing the charge trap structure 124 at the upper surface 401.

Figure 24:
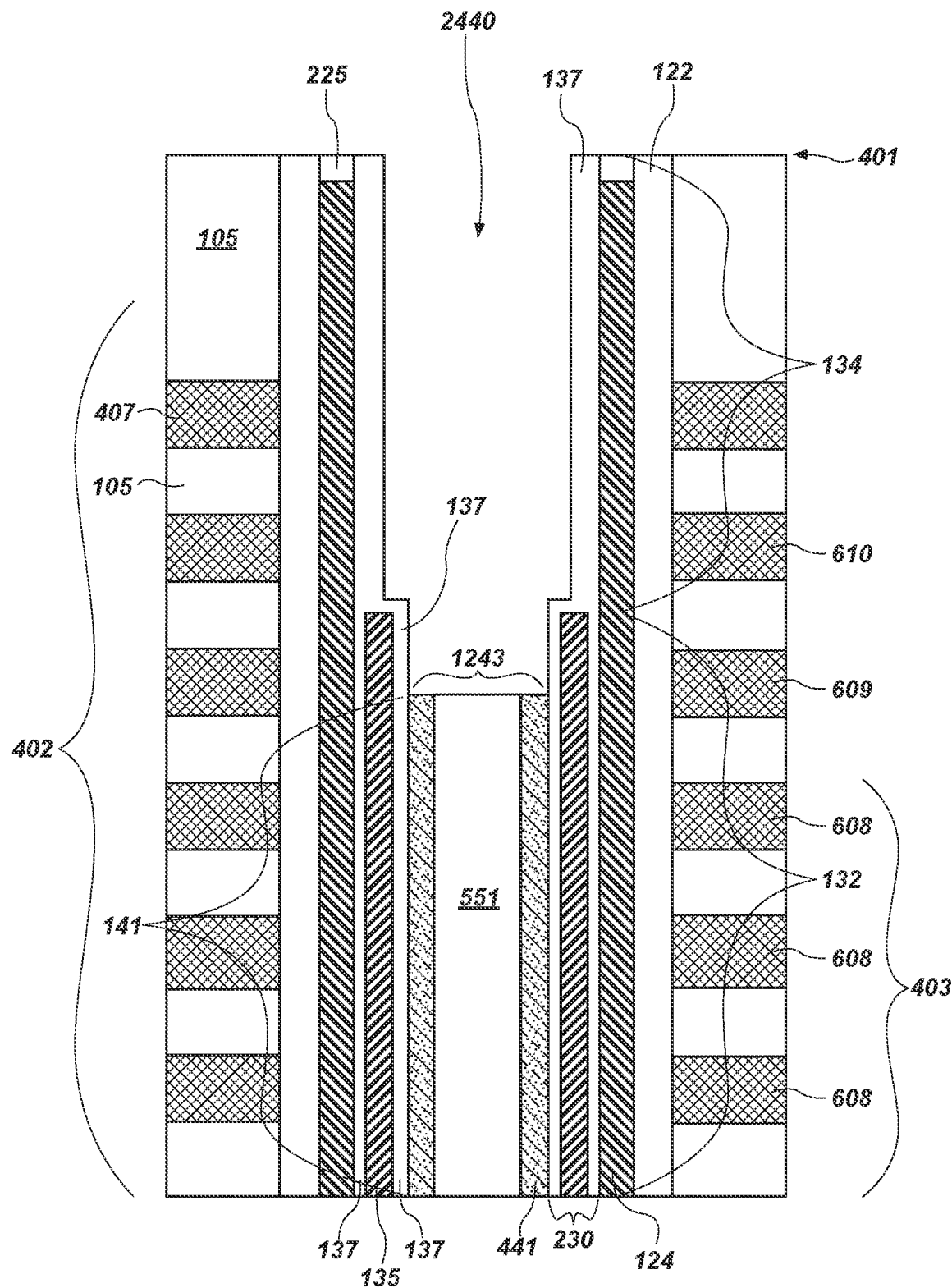
FIGS. 24 through 27 are—in conjunction with FIGS. 4 through 9—cross-sectional, elevational, schematic illustrations during various stages of processing to fabricate the apparatus structure of FIG. 2, according to embodiments of the disclosure, wherein FIG. 24 follows the stage illustrated in FIG. 9.

As illustrated in FIG. 24, the removal of portions of oxide material defines an opening 2440 in which the channel material 441 and the dielectric material 551 have become recessed relative to an uppermost surface of the high-κ material 135, and a thickness of the tunneling structure 230 along the second tunneling structure 134 is thinner than a thickness of the tunneling structure 230 along the first tunneling structure 132. In some embodiments, the high-κ material 135 may remain covered, and not exposed to the opening 2440, by the oxide-only material 137 (e.g., the second oxide layer). In other embodiments, the high-κ material 135 may be exposed in the opening 2440 along the elevations that the high-κ material 135 extends vertically beyond an uppermost surface of the channel material 441.

Figure 25:
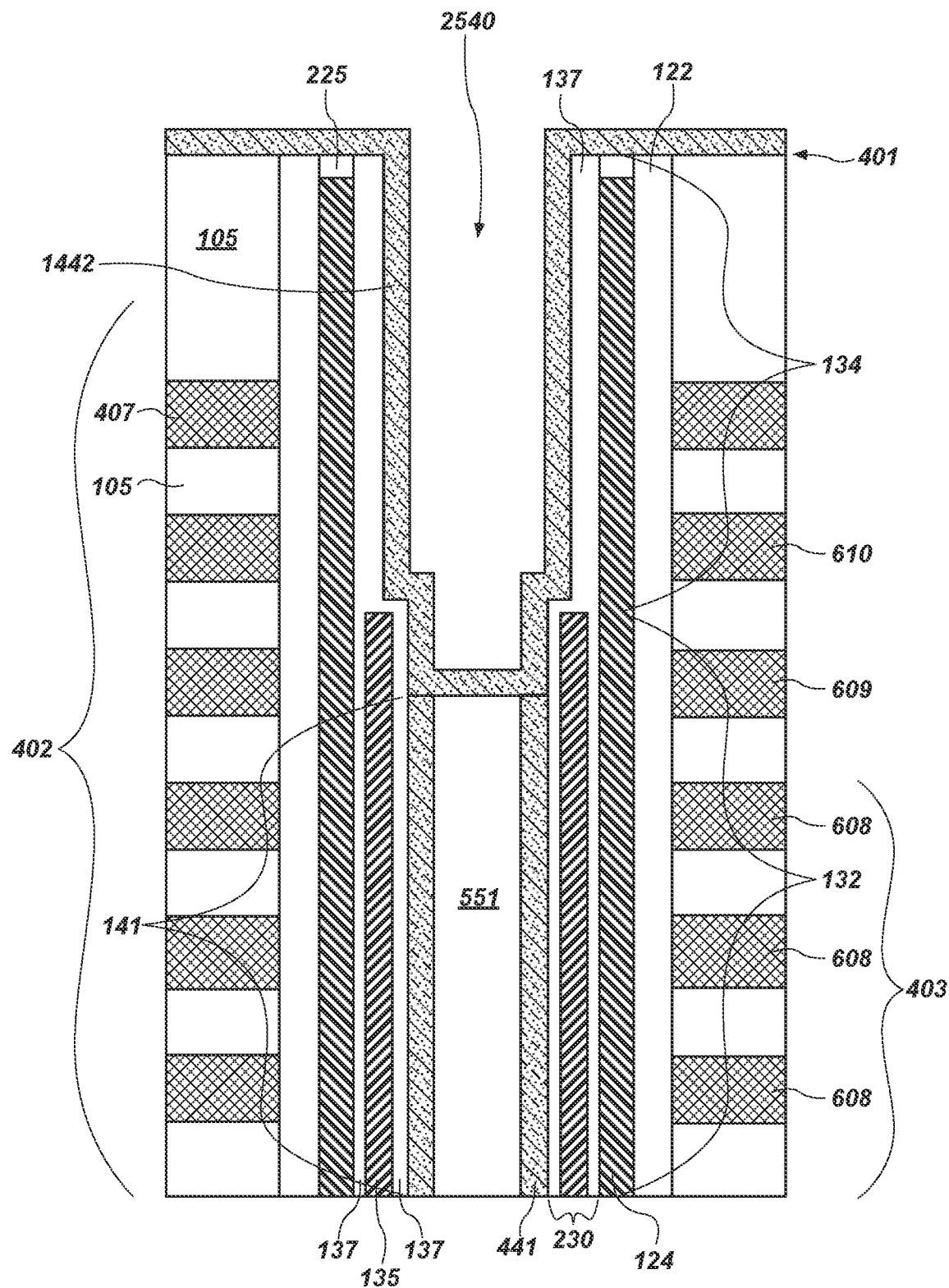
Figure 26:
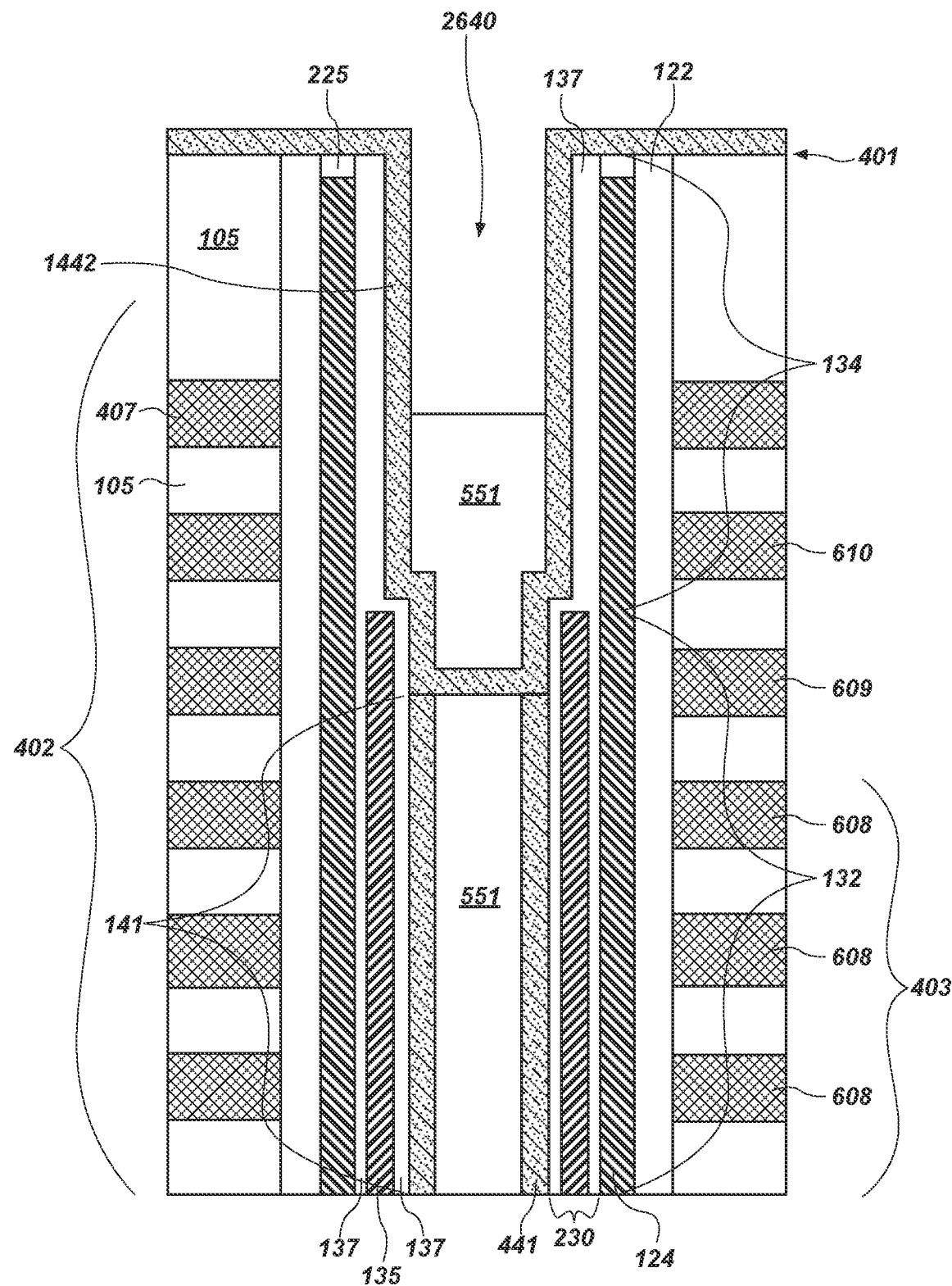
Figure 27:
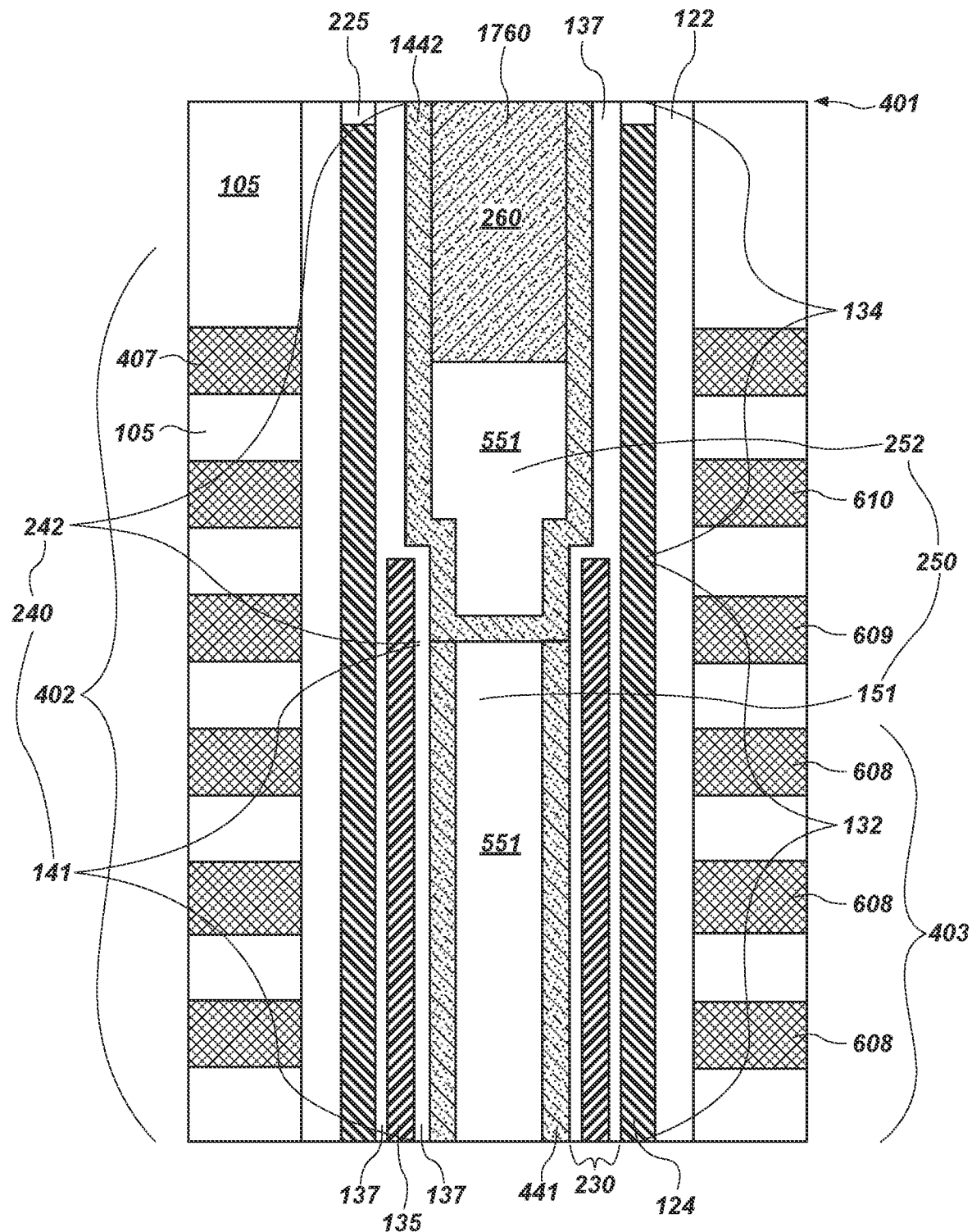

As illustrated in FIG. 25, the other channel material 1442 may then be formed (e.g., conformally deposited) in the opening 2440 (FIG. 24). As illustrated in FIG. 26, the dielectric material 551 may be formed (e.g., deposited) in opening 2540 (FIG. 25) and recessed. As illustrated in FIG. 27, the polysilicon material 1760 may be formed (e.g., deposited) in opening 2640 (FIG. 26). In embodiments in which the other material 407 is a sacrificial material, the other material 407 of the tiered material structure 402 may subsequently be removed and replaced with the conductive material 107 (FIG. 2)—otherwise, the other material 407 may not be removed or replaced—to form the apparatus structure 200 of FIG. 2.

Method embodiments not using a protective liner during the isometric removal stage may be appropriate for forming structures in which control of the EOT of the tunneling structure 130 adjacent the select gate tier(s) 110 is not highly critical.

Figure 28:
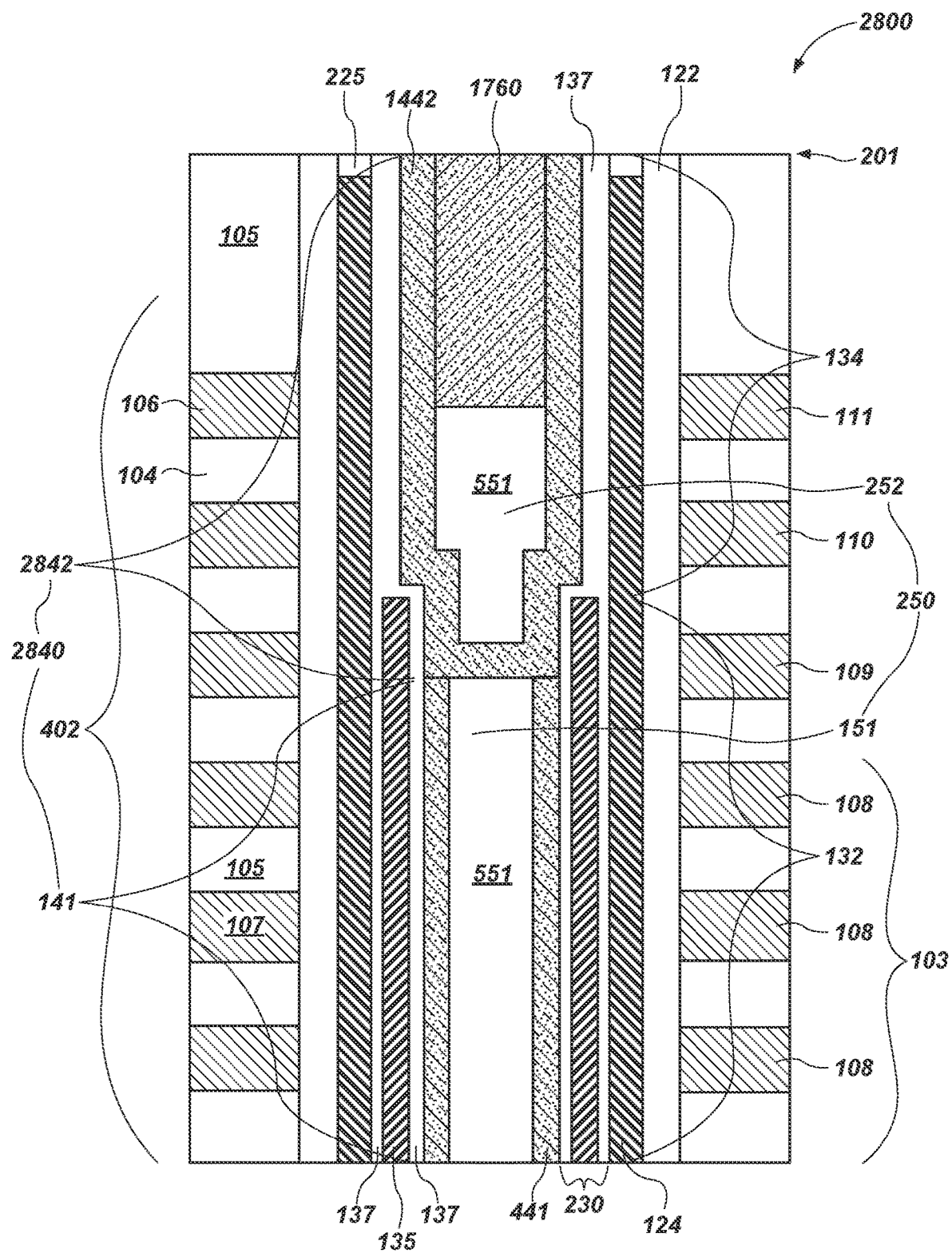
FIG. 28 is a cross-sectional, elevational, schematic illustration of an apparatus structure for an array of storage devices with a 3D NAND architecture, consistent with the embodiment of FIG. 3F, wherein the apparatus structure includes a tunneling structure with a first tunneling structure having a thickness different than a thickness of a second tunneling structure, the apparatus structure also including a first channel structure with a channel material having a lesser thickness than that of the channel material of a second channel structure.
Figure 29:
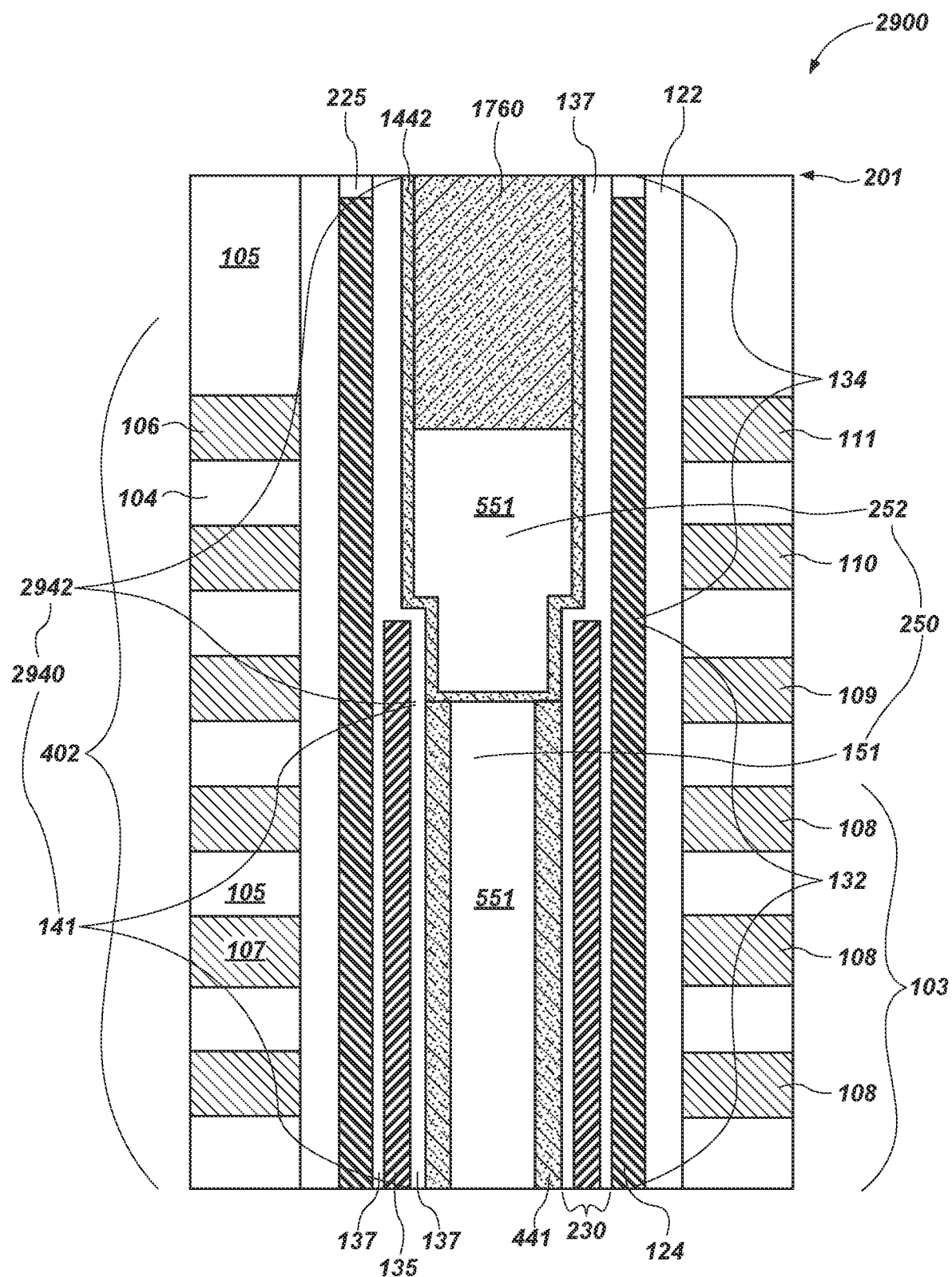
FIG. 29 is a cross-sectional, elevational, schematic illustration of an apparatus structure for an array of storage devices with a 3D NAND architecture, consistent with the embodiment of FIG. 3H, wherein the apparatus structure includes a tunneling structure with a first tunneling structure having a thickness different than a thickness of a second tunneling structure, the apparatus structure also include a first channel structure with a channel material having a greater thickness than that of the channel material of a second channel structure.

As with the protective-liner-including methods, described above, the method embodiments not using the protective liner may also enable tailoring of the thickness of the channel structure along the second channel structure adjacent the select gate tier(s) 110. For example, with reference to FIG. 28 and apparatus structure 2800, the other channel material 1442 of an second channel structure 2842 of a channel structure 2840 may be formed, e.g., as described above with respect to FIG. 25, but to a greater thickness than a thickness of the channel material 441 of the first channel structure 141. (See also, FIG. 3F and T(CH) relative to T(CL) therein.) As another example, with reference to FIG. 29 and apparatus structure 2900, the other channel material 1442 of an second channel structure 2942 of a channel structure 2940 may be formed, e.g., as described above with respect to FIG. 25, but to a lesser thickness than a thickness of the channel material 441 of the first channel structure 141. (See also, FIG. 3H and T(CH) relative to T(CL) therein).

Accordingly, disclosed is a semiconductor device comprising a stack of alternating insulative tiers and conductive tiers. A select gate tier is over the stack. A channel structure extends through the stack and through the select gate tier. A first tunneling structure is between the channel structure and the stack. The first tunneling structure comprises an oxide-high-κ-oxide composite structure. A second tunneling structure is between the channel structure and the select gate tier. The second tunneling structure comprises an oxide-only structure.

Figure 30:
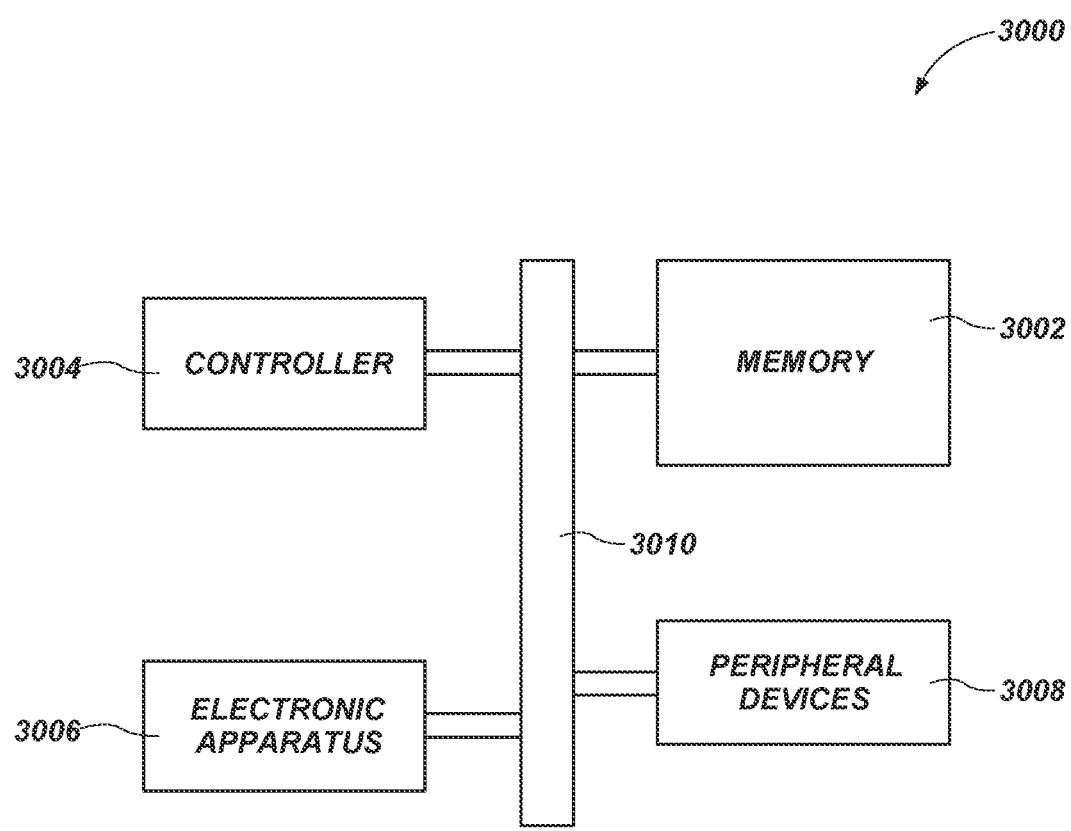
FIG. 30 shows a block diagram of a system that includes memory structured with a vertical array of storage devices, according to various embodiments.

FIG. 30 shows a block diagram of a system 3000, according to embodiments of the disclosure, that includes memory 3002 with a vertical array (e.g., string) of storage devices (e.g., memory devices (e.g., memory cells)). The architecture and structure of the memory 3002 may include one or more of apparatus structures 100 (FIG. 1), 200 (FIG. 2), 2100 (FIG. 21), 2200 (FIG. 22), 2300 (FIG. 23), 2800 (FIG. 28), 2900 (FIG. 29), according to embodiments of the disclosure and fabricated according to one or more of the methods described above.

The system 3000 may include a controller 3004 operatively coupled to the memory 3002. The system 3000 may also include another electronic apparatus 3006 and one or more peripheral devices 3008. The other electronic apparatus 3006 may, in some embodiments, include one or more of apparatus structures 100 (FIG. 1), 200 (FIG. 2), 2100 (FIG. 21), 2200 (FIG. 22), 2300 (FIG. 23), 2800 (FIG. 28), 2900 (FIG. 29), according to embodiments of the disclosure and fabricated according to one or more of the methods described above. One or more of the controller 3004, the memory 3002, the other electronic apparatus 3006, and the peripheral device(s) 3008 may be in the form of one or more integrated circles (ICs).

A bus 3010 provides electrical conductivity and operable communication between and/or among various components of the system 3000. The bus 3010 may include an address bus, a data bus, and a control bus, each independently configured. Alternatively, the bus 3010 may use conductive lines for providing one or more of address, data, or control, the use of which may be regulated by the controller 3004. The controller 3004 may be in the form of one or more processors.

The other electronic apparatus 3006 may include additional memory (with one or more of the apparatus structures 100 (FIG. 1), 200 (FIG. 2), 2100 (FIG. 21), 2200 (FIG. 22), 2300 (FIG. 23), 2800 (FIG. 28), 2900 (FIG. 29)), according to embodiments of the disclosure and fabricated according to one or more of the methods described above. Other memory structures of the memory 3002 and/or the other electronic apparatus 3006 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral devices 3008 may include displays, imaging devices, printing devices, wireless devices, additional storage memory, and/or control devices that may operate in conjunction with the controller 3004.

The system 3000 may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is a system comprising a three-dimensional array of memory devices. The three-dimensional array comprises a tiered structure of insulating tiers interleaved with conductive tiers comprising at least one select gate tier. A charge trap structure is adjacent the at least one select gate tier. A channel structure extends through the tiered structure. An oxide-only material spans directly between the channel structure and the charge trap structure adjacent the at least one select gate tier. At least one processor is in operable communication with the three-dimensional array of memory devices. At least one peripheral device is in operable communication with the at least one processor.

While the disclosed structures, apparatus, systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
a stack structure comprising insulative structures interleaved with conductive structures;
at least one select gate structure over the stack structure;
a first tunneling structure extending vertically through the stack structure, the first tunneling structure comprising a high-κ material;
a second tunneling structure extending vertically through the at least one select gate structure, the second tunneling structure being devoid of the high-κ material, an entirety of the high-κ material of the first tunneling structure being elevationally below the second tunneling structure; and
a channel structure extending vertically through the stack structure and the at least one select gate structure, the channel structure being horizontally interior to the first tunneling structure and the second tunneling structure, the channel structure comprising:
a first channel portion; and
a second channel portion above the first channel portion,
the first channel portion differing from the second channel portion in at least one of a thickness of a semiconductor material, a horizontal outer dimension of the semiconductor material, and a composition of the semiconductor material.

2. The microelectronic device of claim 1, wherein the horizontal outer dimension of the semiconductor material of the first channel portion, at an elevation below the at least one select gate structure, is less than the horizontal outer dimension of the semiconductor material of the second channel portion, at an elevation of the at least one select gate structure.

3. The microelectronic device of claim 2, wherein the thickness of the semiconductor material of the first channel portion is different than the thickness of the semiconductor material of the second channel portion.

4. The microelectronic device of claim 1, wherein the thickness of the semiconductor material of the first channel portion is less than the thickness of the semiconductor material of the second channel portion.

5. The microelectronic device of claim 1,
wherein the thickness of the semiconductor material of the first channel portion is greater than the thickness of the semiconductor material of the second channel portion.

6. The microelectronic device of claim 1, wherein the composition of the semiconductor material of the first channel portion is different than the composition of the semiconductor material of the second channel portion.

7. A microelectronic device, comprising:
a stack structure comprising insulative structures interleaved with conductive structures;
at least one select gate structure over the stack structure;
a first tunneling structure extending vertically through the stack structure, the first tunneling structure comprising a high-κ material;
a second tunneling structure extending vertically through the at least one select gate structure, the second tunneling structure being devoid of the high-κ material; and
a channel structure extending vertically through the stack structure and the at least one select gate structure, the channel structure being horizontally interior to the first tunneling structure and the second tunneling structure, the channel structure comprising:
a first channel portion; and
a second channel portion above the first channel portion,
the first channel portion differing from the second channel portion in at least one of a thickness of a semiconductor material, a horizontal outer dimension of the semiconductor material, and a composition of the semiconductor material,
wherein the semiconductor material of the second channel portion extends across a width of the channel structure to space a first region of a dielectric material from a second region of the dielectric material, the first region of the dielectric material being interior to the first channel portion, and the second region of the dielectric material being interior to the second channel portion.

8. A semiconductor device, comprising:
a tiered material structure comprising an insulative material interleaved with a conductive material;
a vertical structure extending through the tiered material structure, the vertical structure comprising:
a charge-blocking material along a sidewall of the tiered material structure;
a charge storage material along a sidewall of the charge-blocking material;
a tunneling structure along a sidewall of the charge storage material, the tunneling structure comprising:
a first portion comprising a high-κ material; and
a second portion above the first portion, the second portion consisting essentially of an oxide material and being substantially free of the high-κ material, an entirety of the high-κ material of the first portion being elevationally below the second portion; and
a channel structure along a sidewall of the tunneling structure, the channel structure comprising:
a first channel portion along a sidewall of the first portion of the tunneling structure; and
a second channel portion along a sidewall of the second portion of the tunneling structure,
a channel material of the first channel portion differing in at least one of thickness, horizontal outer dimension, and composition from a channel material of the second channel portion.

9. The semiconductor device of claim 8, wherein:
the charge-blocking material comprises silicon dioxide; and
the charge storage material comprises silicon nitride.

10. The semiconductor device of claim 8, wherein the first portion of the tunneling structure comprises the high-κ material interposed between sub-structures of oxide-only material.

11. The semiconductor device of claim 8, wherein the second portion of the tunneling structure consists essentially of an oxide-only material and is in direct physical contact with the high-κ material of the first portion of the tunneling structure.

12. A method of forming a semiconductor device, the method comprising:
forming an opening extending through a tiered material structure comprising an insulative material interleaved with an other material;
forming a charge-blocking material in the opening along a sidewall of the tiered material structure;
forming a charge storage material in the opening along a sidewall of the charge-blocking material;
forming a tunneling structure, comprising:
forming a high-κ material in the opening along a sidewall of the charge storage material;
oxidizing only a portion of the high-κ material to convert the portion of the high-κ material into an oxide material, to form a first portion of the tunneling structure comprising the high-κ material, and to form a second portion of the tunneling structure consisting essentially of oxide material comprising the oxide material formed from the portion of the high-κ material, the second portion of the tunneling structure being substantially free of the high-κ material and being above the first portion of the tunneling structure, an entirety of the high-κ material of the first portion being elevationally below the second portion of the tunneling structure; and
forming a channel structure, comprising:
forming a channel material in the opening along a sidewall of the tunneling structure, the channel structure comprising a first channel portion along a sidewall of the first portion of the tunneling structure and comprising a second channel portion along a sidewall of the second portion of the tunneling structure,
the channel material of the first channel portion differing in at least one of thickness, horizontal outer dimension, and composition from the channel material of the second channel portion.

13. The method of claim 12, wherein forming the tunneling structure further comprises:
before forming the high-κ material, forming a first oxide material in the opening along the sidewall of the charge storage material;
forming the high-κ material along a sidewall of the first oxide material; and
forming a second oxide material in the opening along a sidewall of the high-κ material.

14. The method of claim 13, further comprising, before the oxidizing:
removing an upper portion of the channel material to expose a portion of the second oxide material.

15. The method of claim 14, wherein:
the oxidizing also oxidizes an exposed portion of the channel material, converting the exposed portion into a portion of oxidized channel material; and
the method further comprises, after the oxidizing:
forming a liner adjacent the portion of the high-κ material converted into the oxide material and adjacent the portion of the oxidized channel material;
removing at least a portion of the liner;
removing the portion of the oxidized channel material to expose an upper surface of the channel material; and
after removing the portion of the oxidized channel material, forming a semiconductor material directly on the upper surface of the channel material.

16. The method of claim 15, further comprising, before forming the semiconductor material directly on the upper surface of the channel material, removing remaining portions of the liner.

17. The method of claim 15, wherein:
forming the channel material comprises forming polysilicon; and
forming the semiconductor material also comprises forming polysilicon.

18. The method of claim 14, wherein:
the oxidizing also oxidizes an exposed portion of the channel material, converting the exposed portion into a portion of oxidized channel material; and
the method further comprises:
after the oxidizing, removing the portion of the oxidized channel material to expose an upper surface of the channel material; and
after removing the portion of the oxidized channel material, forming a semiconductor material directly on the upper surface of the channel material.

19. The method of claim 18, wherein:
forming the channel material comprises forming polysilicon; and
forming the semiconductor material also comprises forming polysilicon.

20. The method of claim 13, wherein:
forming the channel material in the opening precedes the oxidizing and comprises forming the channel material in the opening along a sidewall of the second oxide material; and
the method further comprises, before the oxidizing:
forming an oxide fill material in the opening along a sidewall of the channel material;
recessing the oxide fill material in the opening to expose an upper portion of the channel material; and
removing the upper portion of the channel material to expose a portion of the second oxide material.

21. The method of claim 20, wherein the oxidizing also oxidizes an upper portion of the charge storage material.

22. The method of claim 12, wherein:
forming the opening extending through the tiered material structure comprising the insulative material interleaved with the other material comprises forming the opening extending through the tiered material structure, the insulative material comprising a tier oxide material, the other material comprising a tier nitride material; and the method further comprises replacing the tier nitride material with conductive material.

23. The method of claim 12, wherein oxidizing only the portion of the high-κ material comprises oxidizing a portion of the high-κ material adjacent a tier of the other material corresponding to a select gate tier.

* * * * *

UNITED STATES PATENT AND TRADEMARK OFFICE
CERTIFICATE OF CORRECTION

| | |
|---|---|
| PATENT NO. | : 11,925,022 B2 |
| APPLICATION NO. | : 17/643040 |
| DATED | : March 5, 2024 |
| INVENTOR(S) | : Ugo Russo and Chris M. Carlson |

It is certified that error appears in the above-identified patent and that said Letters Patent is hereby corrected as shown below:

In the Specification
    Column 1, Line 12, change "Dec. 28, 2021 the" to --Dec. 28, 2021, the--

In the Claims
Claim 5, Column 24, Line 12, change "of claim 1, wherein the" to
--of claim 1, wherein the--

Signed and Sealed this
Twenty-fifth Day of June, 2024

*Katherine Kelly Vidal*
Katherine Kelly Vidal
*Director of the United States Patent and Trademark Office*